United States Patent [19]
Philipp

[11] Patent Number: 5,122,800
[45] Date of Patent: Jun. 16, 1992

[54] VARIABLE SUCCESSIVE APPROXIMATION CONVERTER

[76] Inventor: Harald Philipp, 4250 W. Lake Sammamish Pkwy. NE., #3052, Redmond, Wash. 98052

[21] Appl. No.: 381,065

[22] Filed: Jul. 17, 1989

Related U.S. Application Data

[63] Continuation-in-part of Ser. No. 301,603, Jan. 26, 1989.

[51] Int. Cl.[5] .................. H03M 1/12; G01R 23/00; G01R 23/16
[52] U.S. Cl. .................. 341/156; 341/164; 341/122; 364/484; 364/487
[58] Field of Search .............. 341/164, 155, 122, 42, 341/158, 156; 324/76 R; 364/484, 487

[56] References Cited

U.S. PATENT DOCUMENTS

| | | |
|---|---|---|
| 3,653,029 | 3/1972 | Kuhlmann . |
| 3,736,511 | 5/1973 | Gibson . |
| 3,855,589 | 12/1974 | Solender . |
| 4,014,023 | 3/1977 | Kirkland . |
| 4,142,185 | 2/1979 | Gordon . |
| 4,194,185 | 3/1980 | Wilson . |
| 4,232,302 | 11/1980 | Jagatich . |
| 4,283,713 | 8/1981 | Philipp . |
| 4,350,974 | 9/1982 | Gordon et al. . |
| 4,438,404 | 3/1984 | Philipp . |
| 4,460,891 | 7/1984 | Bernstein . |
| 4,528,591 | 7/1985 | Liepe et al. . |
| 4,581,602 | 4/1986 | Reichart . |
| 4,625,197 | 11/1986 | Holmes . |
| 4,641,246 | 2/1987 | Halbert . |
| 4,654,584 | 3/1987 | Gyles . |
| 4,688,018 | 8/1987 | Vaughn . |
| 4,691,381 | 9/1987 | Bollard . |
| 4,768,017 | 8/1988 | Philipp . |
| 4,917,083 | 4/1990 | Harrington et al. .................. 606/15 |

OTHER PUBLICATIONS

L. Skarshinski, "Analog-to-Digital Converter", IBM Technical Disclosure Bulletin, vol. 10, No. 11 (Apr. 1968), pp. 1690–1691.
"Morphological Filters—Part I: Their Set-Theoretic Analysis and Relations to Linear Shift-Invariant Filters", IEEE Transactions on Acoustics, Speech, and Signal Processing, vol. ASSP-35, No. 8, Aug. 1987.
Dialog Search Printouts (2 pp.).

*Primary Examiner*—William M. Shoop, Jr.
*Assistant Examiner*—Helen Kim
*Attorney, Agent, or Firm*—Larry A. Jackson

[57] ABSTRACT

Analog electrical signals are converted to digital form by analog to digital sampling in accordance with a variable successive approximation technique that permits extremely wide dynamic range coupled simultaneously with extremely high bandwidth capabilities, low power consumption, and low cost. Each of multiple data (sample) points of the input analog signal are digitally compared to a variable reference generated according to the successive approximation process and changeable modes of that process so as to permit optimum efficiency of conversion at varying rates of acquisition of the input signal. Variable conversion resolutions, gain, and offset settings are offered without resort to amplifiers, AC coupling, or settable attenuators, and applications for this conversion circuitry and method are described including oscillography, time-domain reflectometry, device and network characterization, telephony, video systems, data logging, equipment self-testing, device and process monitoring and control, spectrum analysis, and logic analysis.

20 Claims, 20 Drawing Sheets

FIG. 2
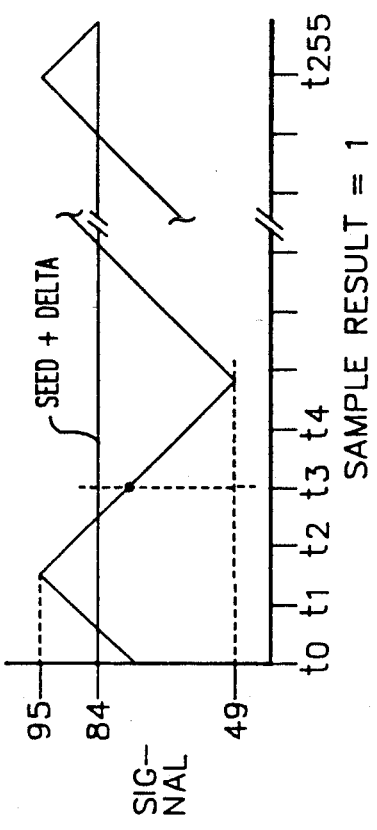
FIG. 2A
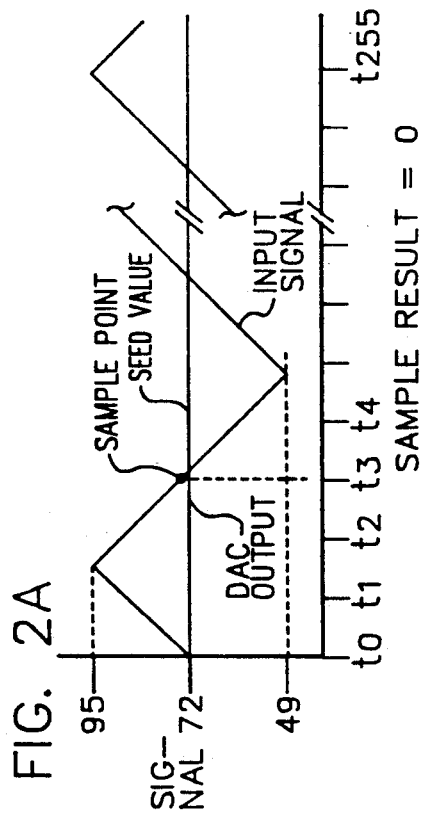
FIG. 2C
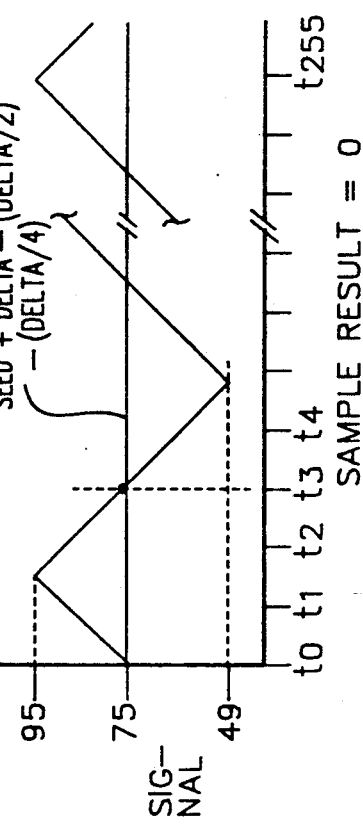
FIG. 2B
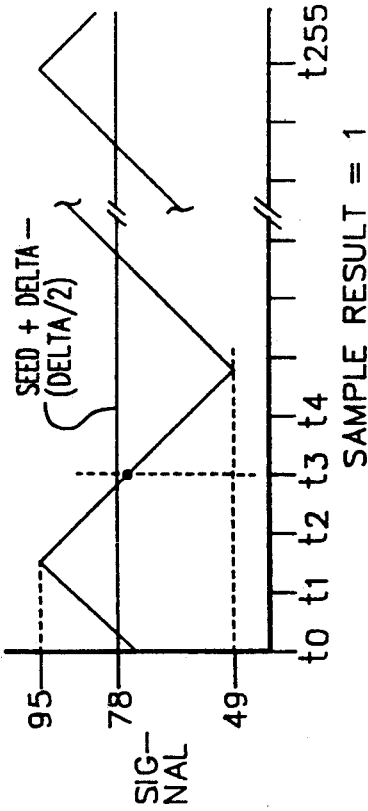
FIG. 2D

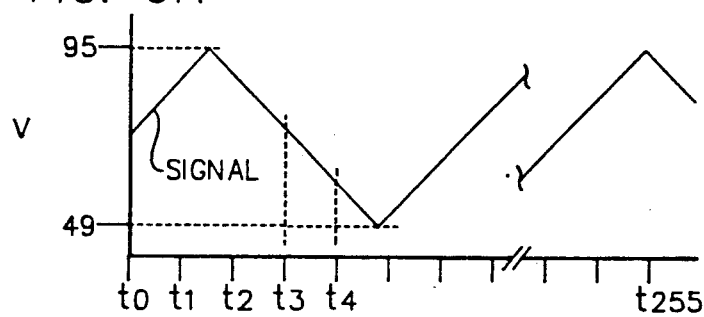
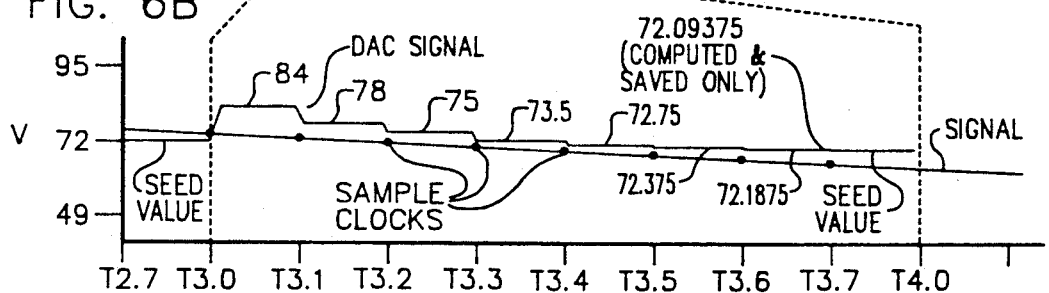
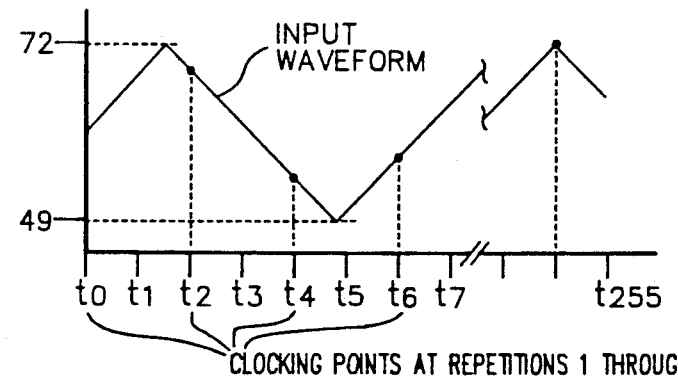
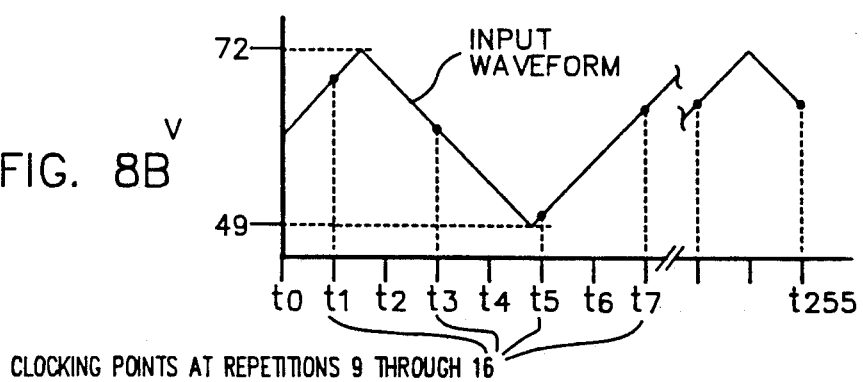

FIG. 7
FIG. 7A
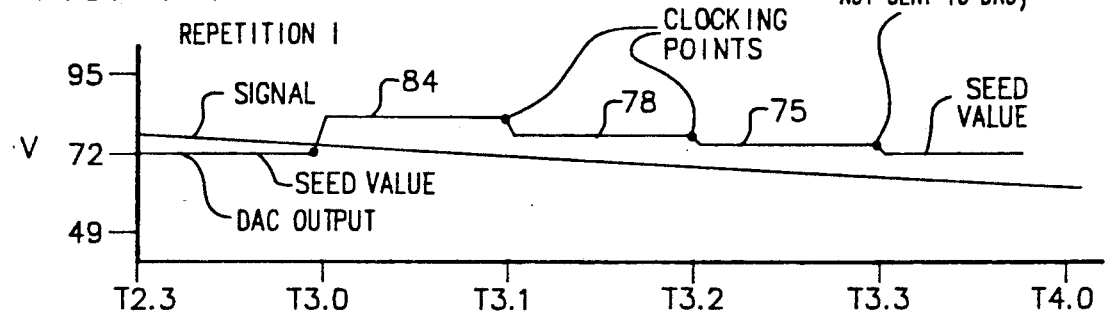
FIG. 7B
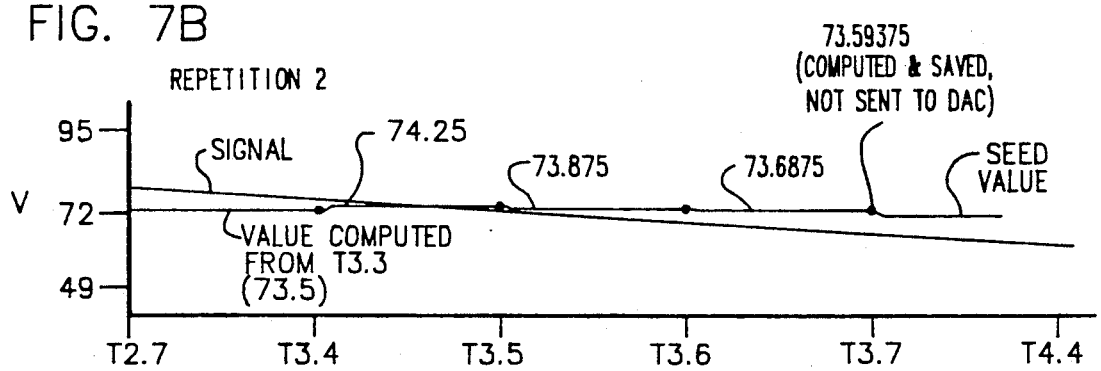
FIG. 5A
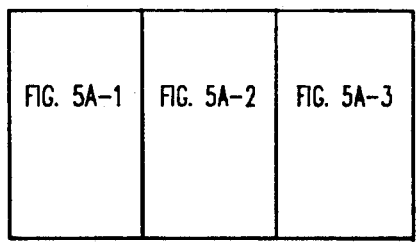
FIG. 10
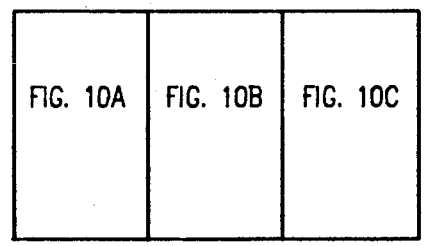
FIG. 12
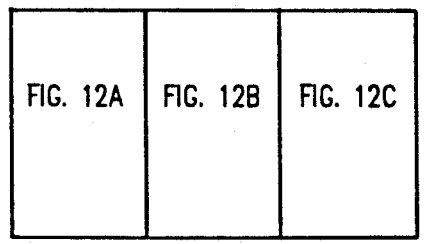

VARIABLE SUCCESSIVE APPROXIMATION CONVERTER

BACKGROUND OF THE INVENTION

This is a continuation-in-part of my copending application Ser. No. 07/301,603 filed Jan. 26, 1989, for SLICING WAVEFORM ACQUISITION TECHNIQUE. The conversion of analog signals to digital form has been of great interest for some time. Many methods of achieving such conversion have been devised. In general, objects of the conversion process are to provide high effective acquisition speed, high bandwidth, high resolution, and high linearity.

TECHNICAL FIELD

This invention generally relates to the acquisition of electronic analog waveforms through a conversion process from analog to digital form, otherwise known as analog to digital conversion.

Efforts to date have centered primarily around a desire to convert analog samples to digital form through a single process or step, or at least to appear to the user to have occurred through a single step. Successive approximation and flash converters are the most prominent examples of the current technology used. Flash converters have been the most promising in terms of speed, offering conversion rates up to 250 megasamples per second (Ms/s) and beyond. Successive approximation and other related methods typically offer the best resolution, but require more time to perform a conversion of an analog sample.

In many systems the need for high effective conversion speeds is accompanied by the presence of a repetitive signal. In such cases, conversion circuitry can be greatly simplified to take advantage of this. Instruments having such repetitive signals include digital storage oscilloscopes, time-domain reflectometers, spectrum analyzers, radar, etc. In such applications a high effective conversion rate accompanied by a wide bandwidth is usually desired; it is not always a requirement that such signal conversion occur in a single waveform repetition. However, it would be generally useful if the conversion process were made such that the conversion hardware were to operate at maximum rates of signal throughput at all effective timebase settings.

Repetitive sampling techniques are most commonly used when signals to be converted contain frequencies too fast to provide adequate conversion banwidths with a given ADC type. In these cases, the analog signal is sampled in a track-and-hold circuit having an appropriately short temporal aperture, after which the conversion process takes place at a much slower rate. A timebase is used to provide sample points in time along the waveform in a repetitive manner until all sample points of interest are acquired. The acquired waveform is then displayed or further processed as required. While this method generally provides acceptable results, it normally requires that the track-and-hold be preceded by an amplifier having adjustable gain and a bandwidth suitable for the application. This is especially true for applications requiring an ability to convert signals over a wide range, such as in an oscilloscope, where voltages may be as small as a few millivolts or as large as many tens of volts.

For high bandwidth applications, amplifiers with alterable gain and offset capability as conventionally used are costly, consume substantial amounts of power, and introduce nonlinearities, settling time and thermal settling effects, saturation recovery effects, slew rate limiting, noise, and other distortions. Track-and-hold circuits similarly consume a fair amount of power, cost a great deal for high speed versions, and introduce yet another source of conversion errors. The amplification and scaling of high frequency signals up to and beyond 1 Ghz is a non-trivial exercise, to be avoided if at all possible. Any innovation that can simplify or eliminate the need for variable amplification and track and hold circuitry at such frequencies would be very desirable.

The need for variable gain and offset capability is further driven by display characteristics and the general need for consistently fine amplitude resolution. For example, liquid crystal displays ("LCD's") have a very coarse resolution compared to vector-scanned CRT's. If an LCD is used to display a waveform, it is generally desirable to display the waveform as large as possible to reduce visual granularity. If an 8-bit ADC is used to acquire a signal that encompasses only one quarter of the full resolution of the ADC, the resulting display will only have 64 levels, making it very grainy no matter whether it is vertically expanded to fit the display or not. Infinitely variable gain and offset capability are thus generally desirable to optimize signal resolution for further analysis or display. An even more desirable implementation would permit continuously automatic gain and offset optimization capability.

ADC's of the flash converter type are theoretically scalable without explicit attenuation or amplification of the input signal by altering the reference voltages at the top and bottom of the resistive reference ladder network. Unfortunately this technique is impractical since the flash converter's internal comparators have serious offset, gain, and propagation delay problems when used with small differential reference voltages, usually resulting in slow, non-monotonic performance.

A further common drawback to most existing repetitive acquisition systems has been an inability to maximize effective conversion rates or throughput at all timebase settings. For example, an oscilloscope having both real-time and equivalent time modes will typically have a sharp drop in acquisition rate when making the transition from one mode to another: at the highest real-time timebase setting, all points per waveform will be acquired; at the next highest setting, only one point per waveform will be acquired. Obviously there is a sharp drop in acquisition efficiency with such circuits as the ADC sits idle waiting for the next waveform repetition to occur; only at very fast timebase settings will the ADC once again perform at speeds approaching its maximum throughput rate.

In my U.S. Pat. No. 4,283,713, I describe one such system for overcoming the latter problem by interleaving sample points using a mathematical principle of odd and even numerical residues to achieve a fairly constant sample rate at timebase settings beyond the real time mode. However, this technique is described only in conjunction with analog ramp timebases, and does not easily lend itself to usually more desirable digital implementations such as that disclosed in my U.S. Pat. No. 4,438,404.

In U.S. Pat. No. 4,768,017, another method of data point interleaving is described which can also increase sampling and conversion efficiency. But in this invention a delay line is employed to interleave data points, severely restricting temporal resolution while introducing a large amount of dead time between the trigger event and the start of acquisitions.

In my copending U.S. Pat. No. application Ser. No. 07/301,603, filed Jan. 21, 1989, a related conversions process is disclosed and claimed which has been called a "slicing technique". The present application is a continuation-in-part of Ser. No. 07/301,603. There is thus a continuing need for acquisition systems employing methods that reduce cost and power while providing high effective signal bandwidths, reduced complexities, simplified variable gain and offset capabilities, and more efficient conversion strategies. As further background, conversion processes using successive approximation are disclosed in U.S. Pat. Nos. 4,460,891 (Bernstein); 3,736,511 (Gibson); 4,641,246 (Halbert, et al); IBM Technical Disclosure Bulletin, "Analog-to-Digital Converter" (L. Skarshinski) Vol. 10, No. 11, Apr. 1968.

OBJECTS OF THE INVENTION

An object of the invention therefore is to provide a method of analog to digital signal conversion of high speed repetitive waveforms.

Another object of the invention is to permit single repetition conversions at slower speeds if so required.

A further object of the invention is to provide an ADC requiring low power consumption.

Another object of the invention is to provide for a wide and possibly variable dynamic range of operation of an ADC.

Another object of the invention is to reduce the requirements for analog preprocessing of the acquired signals, by simplifying or eliminating amplifier and gain control requirements, and by eliminating the need for a sample and hold circuit.

A further object of the invention is to allow a high degree of variability in signal scaling and offsetting, in order to maximize the binary resolution of acquired signals at a given conversion amplitude resolution limit and to allow the continual display of such signals to full display height without then need for point interpolation.

Another object is to provide a method whereby such signal scaling and offsetting can be made to automatically track the input waveform so that it is constantly adjusted to maximize usage of the dynamic range of the internal digital data paths, or the vertical axis of a display (or a fixed portion thereof), independent of changes in actual signal amplitude or offset, and to do so without resorting to AC signal input coupling which would otherwise destroy a portion of the information content of the acquired waveform.

Another object is to provide for a very high conversion efficiency requiring a minimum number of waveform repetitions for a complete conversion, where the number of repetitions required is generally proportional to the effective speed of acquisition.

Other objects of the invention include reduced complexity, size, and cost.

Yet other objects, advantages and novel features of the invention will be described in part in the descriptions which follow, and will become apparent to those skilled in the art upon examination of the following description or may be learned by implementation of the invention. The objects and advantages of the invention may be realized and attained by means of the instrumentalities and combinations particularly pointed out in the claims.

SUMMARY OF THE INVENTION

These objects and advantages are achieved by a unique method and circuit for performing a repetitive successive approximation without conventional amplification, or sample and hold. Equivalent time samples are converted by means of an aproximation process that is disjointed over a number of waveform repetitions, rather than in a continuous, seamless process that completes once for each sample point prior to continuing with the next sample point. At high effective conversion rates, many input waveform repetitions may be required, while at lower conversion rates only one repetition may be required. By disjointing the conversion process it is possible to provide a variable number of required repetitions, depending on the effective sample rate to which the system is set. A digital controller is required that can perform the disjointed approximation steps on one or more waveform repetitions, while keeping all fragments of the conversion process in order.

The conversion technique is termed 'variable' because the binary signal comparisons required at each successive approximation step occur with variable ranges and offsets, and with a variable degree of disjointing over a number of signal repetitions, without the need for a static sample of the analog signal as might normally be provided by a sample and hold or track-and-hold circuit. A circuit implementing the technique is called a variable successive approximation converter, or VSAC.

The VSAC technique can have variable gain attribute built into it, such that the need for an input scaling attenuator or almplifier is reduced or eliminated. This allows an inexpensive variable gain system to be constructed permitting the acquisition of signals spanning a wide range and having varying offsets. As will be seen, the variable scaling and offsetting technique is superior to conventional fixed attenuator solutions, since the variability in effective gain and offset can be made essentially infinite. It also permits the elimination of AC coupling capacitors in line with the input signal. The AC function is normally used to destroy DC offset content where the DC signal would saturate an amplifier, or where the signal offset varies during the course of observation creating the need for constant manual intervention when DC coupled. AC coupling unfortunately destroys some of the information content of the acquired waveform. In this system, AC coupling can be simulated without such information loss by using a process that constantly seeks to center the waveform within the conversion amplitude window and hence within any display screen. Further, the simulation can be made variable, allowing for various time constants as might be suitable for a given use. In all such cases the DC offset information remains preserved, and may be displayed as a number on the display or otherwise employed in further processing means.

In the preferred embodiment, the VSAC has a single analog signal comparator 114 together with a digital to analog converter (DAC) 123, in which comparator 114 has a binary output representative of the signal comparison between the input signal 105 and the DAC 123 (FIG. 1). The comparator 114 has at its output a flip-flop or latch 115 capable of sampling and storing on command the state of the comparator 114 output. The DAC 123 can be of any type, but preferably is of a design either accommodating a wide dynamic range (typically 16 bits or more) and/or having an output 124 whose range can be set arbitrarily over some span of voltages. A digital signal processor ("DSP") type controller 118 and a memory 125 are used in conjunction to set the levels of the DAC 123 and store final and intermediate results, while timebase 110 and holdoff circuit 109 are used to provide sample signals required for the compare sampler flip-flop 115. A host, which may be a conventional microcomputer, controls the operation of dedicated controller 118 as well as various timebase settings; it also extracts acquired data from memory 125 for further processing and/or display. A trigger comparator 103 feeding flip-flop 106 provides for timebase synchronization with the signal 105; the trigger level is settable by a DAC 101, which may be programmed by the host computer. A trigger holdoff circuit 109 whose delay is set by the host permits proper triggering synchronization.

In the past, the successive approximation conversion ("SAC") process has been performed with fixed binary weights. For example, a SAC process involving 8 bits and covering a voltage range from 0 to +1 volt would have a weight for its most significant bit ("MSB") of about 0.5; the next lesser bit weight would be 0.25, the third 0.125, etc. An 8 bit binary value of 10110010 would thus have a net decimal signal equivalent value of 0.6953125 volts. In order to accommodate different voltage ranges, the input signal must be manipulated in a manner so as to fit the fixed range of the SAC device. For example, if a 5 to 10 volt signal is to be acquired, a 5X attenuator must be placed in front of the converter and an offsetting negative voltage must be applied to bring the signal into the 0 to 1 volt range of the converter. In this example, the MSB would then have a signal-related value of $(10-5)/2=2.5$ volts, the next bit 1.25 volts, etc., with an implied offset of +5 volts. However, the adjusted signal actually being converted still only ranges from 0 to 1 volt and the bits have actual weights that remain unchanged from the first case.

Successive approximmation is not necessarily bound by such fixed binary assignments of value. For example, one could define a floating decimal range of 0 to 100, with successive values lying anywhere within the range of 0 to 100. Specifically, consider such a device having 8 successive conversion steps where the MSB has a value of 12, the next lesser level a value of 6, the next 3, 1.5, 0.75 etc., with a starting offset value of 72. Such a device could convert any signal within the range from:

$$72-12-6-3-1.5-0.75-0.375-0.1875-0.09375- = 48.09375$$

to $$72+12+6+3+1.5+0.75+0.375+0.1875+0.09375- = 95.90625$$

Consider further such a system where the weights are made to be variable, not through changes in analog input signal scaling as is done conventionally, but through changes in the actual DAC values themselves. This is the principle that lies at the heart of the conversion process described herein; this principle is used to effect a variable gain and offset capability without resorting to analog preprocessing.

It is important to recognize that the offset value '72' chosen above could have been any other number lying within a range of values constrained only by the amplitude of the conversion process (here, $95.90625-48.09375=47.8125$) and the boundaries of the conversion process (defined here as 0 to 100); likewise, the amplitude or gain of the conversion process is arbitrary, subject only to similar constraints and the ultimate resolution of the system. For example, if the offset in the above example had been '80' with the range remaining 47.8125, then signals below a level of 100 would have been acquired (from 32.1875 to 100), while signals from 100 to 127.8125 would have been truncated to 100 since the system in this example has a range ending at 100.

Due to the arbitrary weights assigned to each step and the desire to avoid confusion with ordinary bit weights, each step determination shall be henceforth referred to not as a bit, but as a value. The term MSB (most significant bit) loses its normal meaning, and will instead be referred to as a "most significant value", or MSV, and at least significant bit ("LSB") will instead be termed a LSV. The term "bit" will still be used where an actual hardwired binary bit of fixed representational value is indicated.

FIG. 2 shows in detail a timing diagram of the partial acquisition of a signal at the data point t3 during the first four repetitions of the circuit of FIG. 1. A number of such conversion steps of a repetitive signal (the total number is a design parameter left to the practitioner) are required to convert the particular data point. The signal is shown to encompass a voltage range from 49 to 95 as per the previous example. FIG. 2A shows that DAC 123's output line 124 has been set to the input signal center level of 72, here called the "seed value"; at the point in time marked 't3' the flip-flop 115 is clocked and its output on line 117 becomes a logic '0' since the DAC level is lower than the input signal at the moment clocking occurs. This logic level is fed to DSP controller 118, which causes the comparison level to be incremented by the value 'delta' (where delta is 12) as shown in FIG. 2B. After the next signal repetition and clocking at time t3 in FIG. 2B, the new result on line 117 becomes a logic '1', indicating the DAC level on line 124 has been set higher than the input signal at that point. Controller 118 then decrements the DAC level on line 124 by 'delta/2' or 6 to lower the DAC level on the next repetition (FIG. 2C). Similarly an adjustment of 'delta/4' or 3 is made on the next pass, etc. until the number of desired approximations have occurred. The ending binary value of this sequence then becomes the conversion of the signal at point t3. For example, in FIG. 2D, the value 75 represents the conversion of the input signal at t3, albeit after only three comparisons.

When 8 such signal repetitions are performed, there will be 256 possible resulting quantization levels. It is also important to note that the successive values on line 117 taken together represent the simple binary equivalent of the conversion process, without containing the absolute level. For example, after the clock cycle at t3 as shown in FIG. 2D, the bit stream '0110' will have occurred on line 117, which represents the simple conversion value of the input signal at time t3. In some applications the acquisition of the simple conversion is sufficient, and the full numeric conversion may be discarded. In another embodiment to be described, the full numeric conversion is never obtained during the course of acquisition, but can be numerically reconstructed from control parameters when desired.

Three embodiments of the invention are disclosed. The first embodiment (Method 1) is shown in FIGS. 1 and 2 and involves the use of a wide dynamic range DAC, typically having 16 or more bits resolution even if only 8 value conversions are required, together with control circuitry (which may be implemented by a programmed microcomputer). With such circuitry the first embodiment computes the DAC levels 'on the fly' from data provided to it by the user, another computer, or from its own knowledge of the input signal characteristics. This first process generally requires only additions, subtractions, and divisions, the latter of which may be performed in a simple shift-right operation. FIG. 1 and FIG. 2, respectively, illustrate a typical Method 1 circuitry and one Method 1 acquisition mode sequence.

A second embodiment (Method 2) is shown in FIG. 3 and is similar to Method 1, except that the DAC levels are precomputed and inserted into a lookup table which is accessed by the 16 bit DAC; and the lookup table is precomputed in a separate step, again in response to user inputs, signal characteristics, or other control parameters or algorithms. A high speed controller acts to feed the proper lookup entry to the DAC at the proper moments during the conversion process. A convenient method for accomplishing this is through a type of clocked SAC register 333 such as shown in FIG. 3.

A third embodiment (Method 3) shown in FIG. 4 requires only an 8-bit DAC (or however many bits are desired for the final value resolution), but its output must be scalable and offsettable to accommodate the range of expected input signals. DACs having multiplying inputs are commonly available; these can have their output ranges adjusted by feeding varying amounts of reference current to them. Offsets can be accommodated by a separate circuit at the output of the 8-bit DAC. In practical use, the range and offset values are adjusted by other DACs, typically having 12 bits of resolution or more. The controller for Method 3 must simply provide an ordinary successive approximation drive to the DAC. Methods 1 and 2 do not require additional analog circuitry for range and offset, but are typically slower to convert since available 16 or more bit DACs are much slower than many common 8-bit DACs.

As a more concrete example of the conversion process, consider a Method 1 ADC having a 16 bit DAC and a high speed state-machine controlled DSP. Assume further that its input signal range can encompass voltages from $-2$ to $+2$ volts, corresponding to hexadecimal values of 0000H and FFFFH (0 to 65535 decimal). Assume not that an 8-value conversion process (i.e. having the same resolution as an ordinary 8 bit converter, that is, 256 possible levels) is desired, and a 0.157 volt amplitude signal is currently being acquired, having its center point currently offset at $+0.351$ volts. The numbers chosen here are completely arbitrary for this example, and may in actuality lie anywhere between $-2$ to $+2$ volts. Simple arithmetic shows that the center of the signal lies at an equivalent DAC related value of $$((0.351-(-2))/(+2-(-2))) * 65535 = 38518 \text{ (9676H).}$$

It has an AC amplitude of $$(0.157/(+2-(-2))) * 65535 = 2575 \text{ (A0CH).}$$

Conversion may occur if on the first pass the DAC is set to the center value of 9676H, and on successive passes the values A0CH/4, A0CH/8, A0CH/16 . . . A0CH/512 are either cumulatively added to or subtracted from the initial center value in response to the output of the comparator flip-flop. After 8 such passes, the data point will have been converted to an 8-value resolution (having 256 possible levels) in a 16-bit space, the range and offset having been defined within that space to suit the input signal.

Method 2 uses the same principles as just described, except that additions and subtractions are not performed during the course of the conversion. Rather, a lookup table supplies the DAC with the proper values, while the lookup table is in turn addressed with a more conventional 8-bit SAC register. This method has the advantage that less hardware is required to perform the real time numerical computations; instead they are precomputed by a more general purpose microprocessor (the host) and placed into the lookup table, which can simply be a 16-bit wide RAM having 256 locations for an 8-value resolution conversion.

Method 3 is similar to Method 2 in that numerical computations are not required during the course of the conversion process. But instead of performing a digital lookup, the scaling and offsetting of DAC values is done in the analog portions of the DAC output signal as described previously.

All three embodiments (Methods 1, 2 and 3) have features that may be combined with the variable aspects of the repetitive conversion process as described above to produce extremely wide bandwidth conversions. The three Methods may also be used alone in a real time conversion system without resorting to repetitive techniques when the DAC settling time, computation time, and comparator response times are in sum sufficiently fast to provide acquisition of signals at the desired rates. The three Methods may also be used with a conventional input signal sampler if so desired; such a system also does not necessarily require that input scaling or amplification be performed, provided that the sampler has sufficient dynamic range to accommodate that of the VSAC conversion process. As will be shown, systems have been built that are capable of both modes (real time and repetitive), as well as two intermediate modes which blend real time and repetitive modes together at transitional acquisition speeds to provide the maximum acquisition rate possible while always providing the full signal scalability exhibited by Methods 1 through 3.

In the above summarized manner, an arbitrary input signal may be acquired to a suitable precision without input scaling or amplification. The techniques of the three Methods as well as the variable acquisition disjointing process will be described in greater detail below in conjunction with the accompanying drawings.

BRIEF DESCRIPTION OF THE DRAWINGS

FIGS. 2A-2D are waveforms that show the VSAC acquisition process acquiring a repetitive analog signal during the first four repetitions of the input waveform in Mode 4, as would occur in any of the Methods but particularly with Method 1 corresponding to the embodiment of FIG. 1.

FIGS. 6A and 6B show waveform diagrams of the acquisition of a signal in a Mode 1 (particular operating mode described herein), as would occur when used together with any of the Methods, but particularly Method 1.

FIGS. 7A and 7B shows waveform diagrams of the acquisition of a signal in a Mode 2 (another operating mode), as would occur when used together with any of the Methods, but particularly Method 1.

FIGS. 8A and 8B show waveform diagrams of the acquisition of a signal in a Mode 3 (still a further operating mode), as would occur when used together with any of the Methods, but particularly Method 1.

DETAILED DESCRIPTION OF THE EMBODIMENTS

Figure 1:
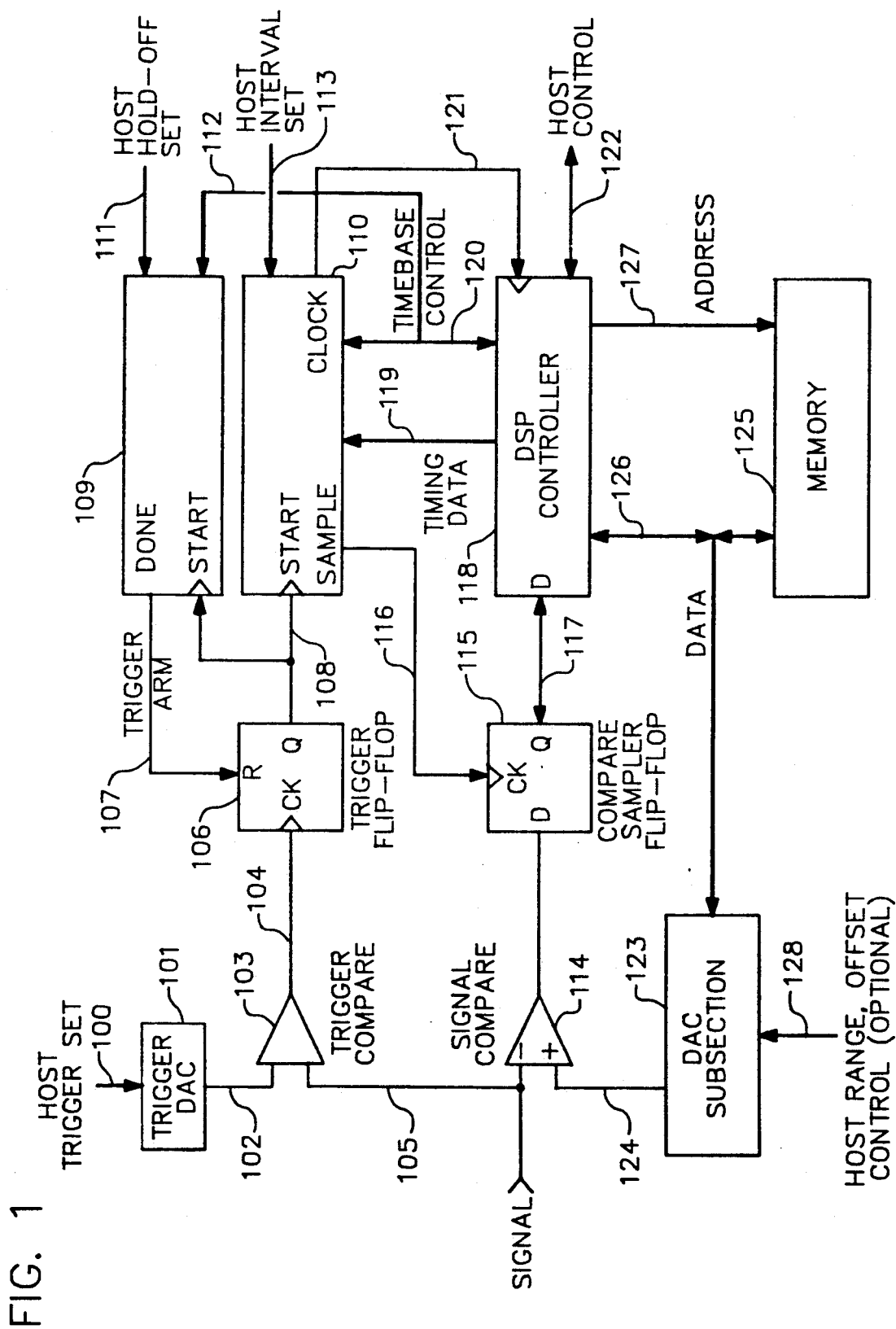
FIG. 1 shows a general block diagram of a preferred embodiment of the acquisition converter employing VSAC Method 1, wherein a DSP type controller is used to compute the successive values of signal approximation with variable range and offset.

The embodiment of FIG. 1 shows a block diagram for a Variable successive approximation coverter (VSAC) employing Method 1 of the invention, as may be, for example, employed in an oscilloscope. A more detailed showing of this first embodiment appears in FIG. 5A and includes:

A state machine controller 576 for controlling the entire system responsive to a host microprocessor or other controller ("host"); the state machine may be constructed with microcoded memory and registers as in the Altera EPS448, or with random logic and one or more registers as is common in the art.

Control mode select lines 579 which are set by the host with values used to determnined the mode of operation of the system and also to facilitate data transfers and various other control features.

A handshake flip-flop 581 which indicates to the host the current state of the system, used principally during the transfers of data and control commands between the host and the ADC.

The conversion DAC 540 having as its input a latch or register into which is stored the various conversion values under control of the state machine from either memory 536 or the ALU 557. As implied by the bus width, this is a 16 bit function.

Input signal comparator 501 having fed at one input the input signal and the other input the output of the DAC 540.

A hold-off circuit 512 used to delay the start of the next acquisition cycle from the beginning or end of the prior waveform repetition. Hold-off circuits commonly employ capacitively generated delays, but digital techniques and combined digital-analog methods may be used as well. In some implementations and applications the hold-off function is not required.

A trigger circuit composed of comparator 510, trigger threshold setting DAC 509, and trigger flip-flop 511 for providing the synchronization of the system to the input signal.

A force-run control bit flip-flop 516 which allows the host to compel the system to operate even in the absence of external triggering signals by forcing the oscillator to run. Flip-flop 516 accomplishes this by forcing trigger flio-flop 511 into its 'set' state. Flip-flop 516 is reset under state machine control.

A register 522 which is used to hold a value computed by ALU 557, the contents of which determine the delay in time from the trigger point to the point at which sampling occurs. The contents of the lower part of this register are fed to delay generator 517 and the upper contents to timebase 503.

A register 524 which holds a digital value used to determine the spacing of sample clocks issuing from timebase 503 when timebase 503 is used to sample multiple points along a single repetition of a waveform.

A delay generator 517 which introduces a delay into the trigger signal, the delay being programmably settable by ALU 557. The delay controls the temporal point at which one or more samples of the input signal will occur. The delay generator may be a programmable delay line, or more commonly a voltage or current ramp feeding a comparator fed also by a settable DAC. The amount of delay introduced by 517 is a function of a lower order group of bits of the binary value placed into register 522 which in turn is computed by ALU 557. The delayed trigger output appears on line 518 some time after line 513 is asserted in response to a trigger event.

A gated oscillator 519 which synchronously starts to oscillate in response to the delayed trigger signal on 518, the output 520 of which is fed to timebase 503; it also provides the clock signal to the state machine so that all operations are performed synchronously with the input signal.

Delay-line oscillators are very suitable and are commonly known in the art, buy triggerable astable multivibrators are also usable. It is possible to compensate for drift in the oscillator by making periodic frequency measurements of its output, as with a crystal controlled frequency counter, either by periodically forcing the oscillator to operate for a time or by making measurements during the normal operation of the system, and then applying a compensating time constant to the oscillator to correct its frequency in a negative feedback fashion, either under software and/or hardware control. Such a frequency is not shown, but one may be simply incorporated if desired.

A timebase 503 for providing single sample clocks to sample flip-flop 502 via line 504 with synchronously variable delays referenced in time to the oscillator which in turn is referenced in time to the input signal, and also capable of providing multiple sample clocks on 504 if commanded by the state machine, also synchronous with the input signal in order to provide multiple sample points during each repetition of the input signal.

The timebase 503 can provide an initial time delay composed of an integer number of clock cycles on 504, the number determined by a value contained in an upper group of bits stored in register 522. The timebase may also cause a variable integer number of cycles of clock 504 to occur between multiple sample clocks within a single waveform repetition if placed in multiple sample clock mode, the number of clock cycles on 520 occurring between said sample clocks being determined by a value stored in register 524.

The timebase must be designed to provide both an initial time delay prior to the issuance of any sample clock on 504 determined by the contents of register 522, immediately followed by a multiple sample clock mode of clock spacing determined by the contents of 524, if all the modes of operation of the invention to be described are to be implemented. A further detail of the timebase is to be found in FIG. 5B, which will be discussed later herein.

Comparator storage flip-flop 502 which stores the value of comparator 501's output on command from the sample clock 504 initiated by timebase 503; this flip-flop may also be a latch, and may furthermore be integrated into the comparator itself, as in the Plessey SP93802. In this block diagram, 502 is assumed to clock on a rising edge of 504 if a flip-flop or to hold its state when line 504 is at a logical '1' if a latch is used.

A digital memory device 536 for storing intermediate and final data values as well as various required parameters such as the center point value (the 'seed') and timebase settings. Special address lines 537 by state machine 576 are used to allow the state machine to select between regions of memory for use in selecting intermediate or final data values.

A parameter buffer 529 which is used by the state machine 576 to define fixed addresses used for storage of various binary values in memory 536 as may be required during acquisition.

An arithmetic logic unit (ALU) 557 for either adding or subtracting successively smaller values (the "delta" value) to the previous DAC value in response to flip-flop 502 contents, used also for computing new timebase delay offsets for loading into register 522; a suitable ALU might be a Logic Devices L4C381.

A logic gate 556 used to permit the forced addition of values by the ALU independent of flip-flop 502's output when so instructed by the state machine, for example when incrementing timebase delays.

A shifter 572 for dividing the delta value during successive phases of the acquisition process; a typical implementation might include two 74AS299's.

A bidirectional register 546 for allowing bidirectional access to the circuit by the host to permit parameter initializations and the recovery of converted data values; a register similar to two 74AS652's is implied in this diagram, but in practice two separate data path register sets may be employed.

A storage register 563 for saving initial and intermediate delta values during the course of acquisition; this register is also implied to be composed of two 74AS652's but may be designed using separate register and three-state buffer elements. This register may pass data transparently between the D- and S-busses, or may store data from the D-bus for later use on the S-bus.

A register 568 for storing a timebase increment value to permit the timebase delay to be altered between data points; this register is directly accessed by the host.

An address counter 525 for supplying address location information to the memory device 536; a suitable part might be a 74F579.

An extraction address register 532 which permits a host controller to recover specific data values it requests from memory 536. A suitable register is a 74AS574. While this implies only 8 bits of horizontal resolution (256 data points) in practice there is nothing that prevents the design of a system having an arbitrarily large number of data points.

Two control flow loop counters 584 and 589 that are loaded by the host and are used in certain modes by the state machine. With these, process loops can be made to occur a variable number of times according to the desired effect. These registers can be clocked by the state machine via lines 585 and 590; when a terminal count is reached, the counters signal this to the state machine for control flow purposes. The state machine may cause a reload of the original setting when required via lines 586 and 591. An example of a part suitable for these is a 74AHCT592.

Various digital busses are used to shuttle digital values between the elements. In this implementation a 16 bit system is shown, and accordingly a 16 bit data bus 543 ('D' bus) connects the primary elements together, principally the ALU 557, the memory 536, and the DAC 540. In practice this bus may be made wider or narrower to suit the application.

Another bus 526 ('A' bus) is used to carry address information to memory 536; this bus can be fed any of the values contained in the extraction address register 532, the address counter 525, or the parameter address buffer 529. It needs only enough bits to permit storage of the required acquisition length plus any intermediate results and required constant parameters. While an 8-bit bus is shown, longer acquisition lengths would in general require a wider A-bus.

Another bus 561 ('S' bus) is used to supply delta and timebase increment values to the ALU. It is a separate bus to allow a greater degree of parallelism in the functioning of the process, but may if desired be eliminated and replaced simply with an extension of the D-bus. The S-bus in general has a similar number of bits as the D-bus.

Not shown are an optional delay line to permit observation of signals occurring just before the trigger; such a delay line may be placed either in the input signal path just prior to comparator 501 or it may be placed between comparator 501 and flip-flop 502 to permit the use of an inexpensive, lower quality delay line as might commonly be used to delay digital signals. The use of such a delay line is common in the art and is not essential to understanding the invention.

Also not shown is an optional input signal buffer and/or signal terminator which might be used to interface to a signal source. Such a buffer typically has a high input impedance to allow the use of oscilloscope attenuator probes. If high bandwidth transmission lines are connected, a terminating resistor in the characteristic impedance of the transmission line is used at the input.

The above mentioned digital logic elements of the system essentially compose a special high speed computer or DSP. There are many other possible configurations of hardware that are known or easily devisable by practitioners in the art; some of these can make use of readily available DSP chips.

Although other procedures or sequences may be followed especially if the system hardware is modified for any reason, the following is a typical example of how the system is used.

In order to facilitate control it is first necessary to force the system to operate; this is accomplished by having the host set the force-run flip-flop 516 via line 544 temporarily and by asserting state machine reset control line 588 active to place the state machine into a known initial (reset) state, and to allow the state machine to operate upon subsequent release of the reset line 588 regardless of the presence or absence of external trigger signals. Since the state machine operates on the system clock 520, the absence of a triggering input signal or the misadjustment of the threshold level on line 505 will prevent the ADC from running, hence the startup sequence just described. The host then clocks line 583, causing flip-flop 581 to be set.

The host next sends to register 524 the value of delay between data points ("space-t"), if multiple sample clocks are to occur within a single waveform repetition as described for modes 1 through 3 below. It then sends to the ADC system through register 546 the timebase initial delay value ("delay-t"), and then clears the reset control line 588 to allow the state machine to operate to accept the data in 546. The state machine then forces the delay-t value in 546 into a predefined location in memory 536; it then resets handshake flip-flop 581 to indicate that this action has been completed, and waits for the next command. The delay-t value allows for delayed timebase operation, and may vary from zero to any practical number limited only by hardware constraints. Space-t may vary from zero (if multiple-point operation is disabled) to any arbitrary integer number (within the capabilities of the hardware) if a multiple sample clock per repetition mode is enabled.

The host meanwhile polls line 577 to determine if the command was executed by the ADC; if so, it de-asserts line 544 to the force-run flip-flop (which will remain set until cleared by the state machine itself later on), then sets the signal amplitude delta value to the register 546. A similar handshake process then occurs, except that this time the value is transferred by the state machine into register 563 and also into shifter 572. A copy remains in register 563 for repeated transfer to the shifter at later points in the algorithm, since the shifter destroys the original copy during the shift process. Another method would have been to incorporate a single register for delta value storage plus a barrel shifter which performs shifts without destruction of the register contents.

The host next sets the signal offset seed value into register 546. Due to the internal construction of register 546, this value will remain in place even though the same register will later accommodate transfers from ADC to host. After loading the seed into 546 the host places in register 568 the value for the temporal distance between data points ("delta-t") and then signals to the state machine via flip-flop 581 that all data is in place and that acquisitions may be performed. As several modes of operation are possible, this final transfer signal from the host also typically commands the state machine via lines 579 to enter one of the several specific operational modes.

The state machine then sends a copy of the seed value in register 546 to the DAC 540, setting the DAC output 541 to a level presumed to be (but not necessarily) at the center of the signal being acquired. The force-run flip-flop 516 is then reset by the state machine via line 545 and acquisition begins, provided that a signal exists to trigger the system. In systems having continuous input signals the lack of signal is obviously not an issue, nor would it be an issue in cases where the system is used with a self-generated stimulus such as in a time domain reflectometer ("TDR"). In the case of a TDR, the entire trigger circuit composed of elements 509, 510, 511, 512, and 516 is not even required since stimulus and hence reflection signals are easily made inherently repetitive and synchronous with the acquisition process. A TDR-style hardware structure will be described later herein.

As the force-run flip-flop 516 is reset, the trigger circuit is simultaneously reset and armed and waits for the first trigger point. After the trigger occurs, a sample clock is generated by timebase 503 to latch a binary comparison of the input signal with the first DAC value (the seed) (refer also to FIG. 2). This comparison is fed to the ALU via gate 556, where it is used to decide whether to add or subtract the first delta value from the seed value. The seed value is fed to the ALU, as is the delta value; if the comparison result indicated that the signal at the sample point was higher than the DAC seed value, the ALU will be forced to add; if lower, it will subtract. The result is fed back to the DAC 540 to generate the next comparison level. The delta value is then divided by two by shifting the delta value in register 572; the divided result is fed again to the ALU. On subsequent cycles the shifted delta value is added to the previous result (i.e. the value fed to the DAC), not to the seed. The process repeats until all desired values for the data point have been acquired. If 8 conversion values are used, (i.e. 256-level resolution) then the process must repeat 8 times before starting over with the next data point.

Prior to sampling the next data point, the timebase may or may not require that it have its temporal sample point delay setting altered. If such a change in delay is required, then the timebase setting delay-t must be altered. As the timebase setting is a function of the binary values fed to it, the ALU may be conveniently used to provide this increment: delta-t is added repeatedly to delay-t and latched into the timebase delay-t register 522 until all temporal data pointa are acquired. At the end of he acquisition, the register 522 is refreshed with its original starting value previously stored in memory 536, and the process repeats. In real time mode and in one of the intermediate modes to be discussed, it is not required to perform this delay incremnting process.

Figures 1, 5A:
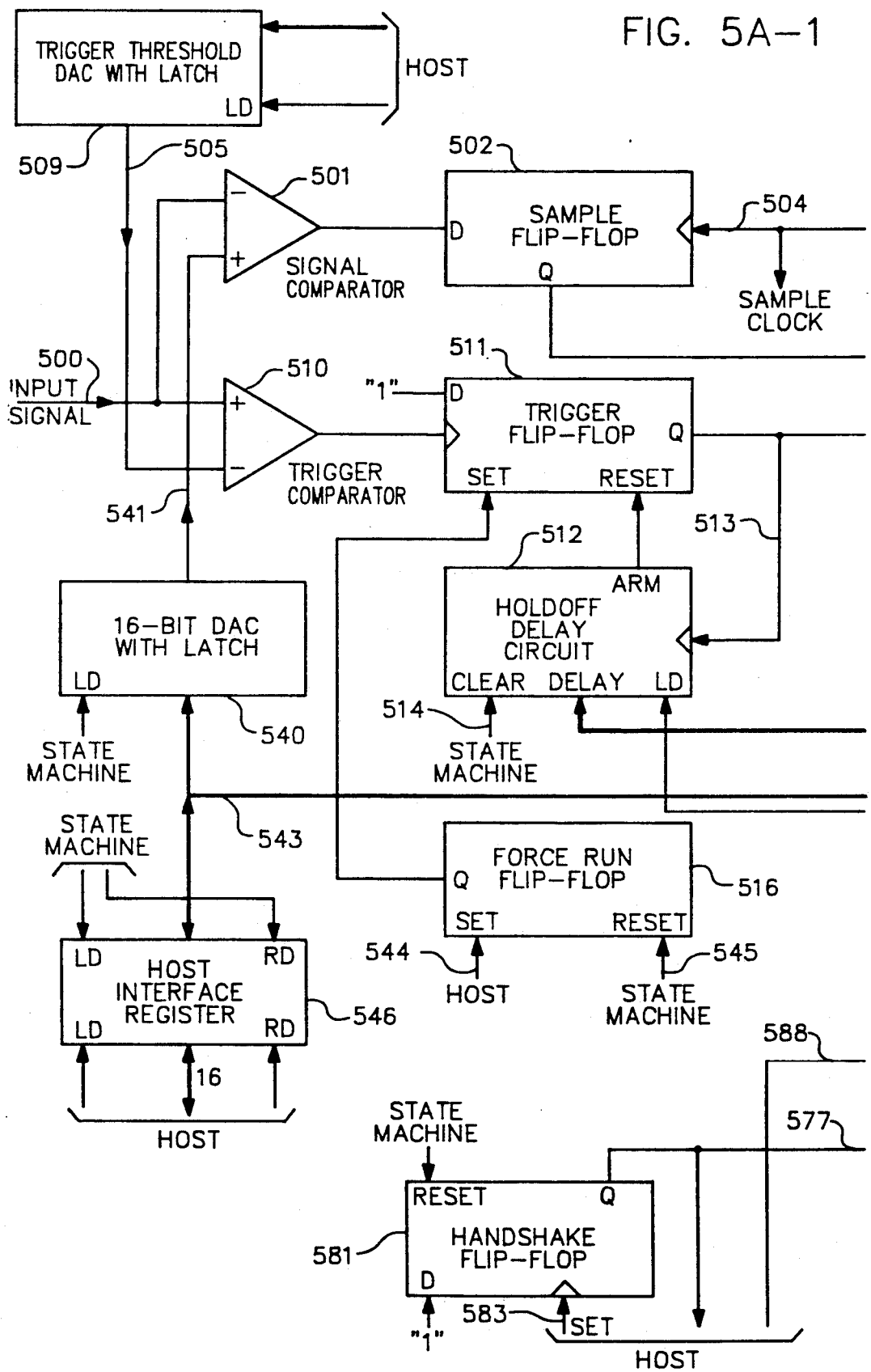
FIG. 5A consisting of parts 5A-1, 5A-2 and 5A-3, is a block diagram of the embodiment of Method 1 corresponding to FIG. 1, showing various internal elements and signal paths contained therein.
Figures 2, 5A:
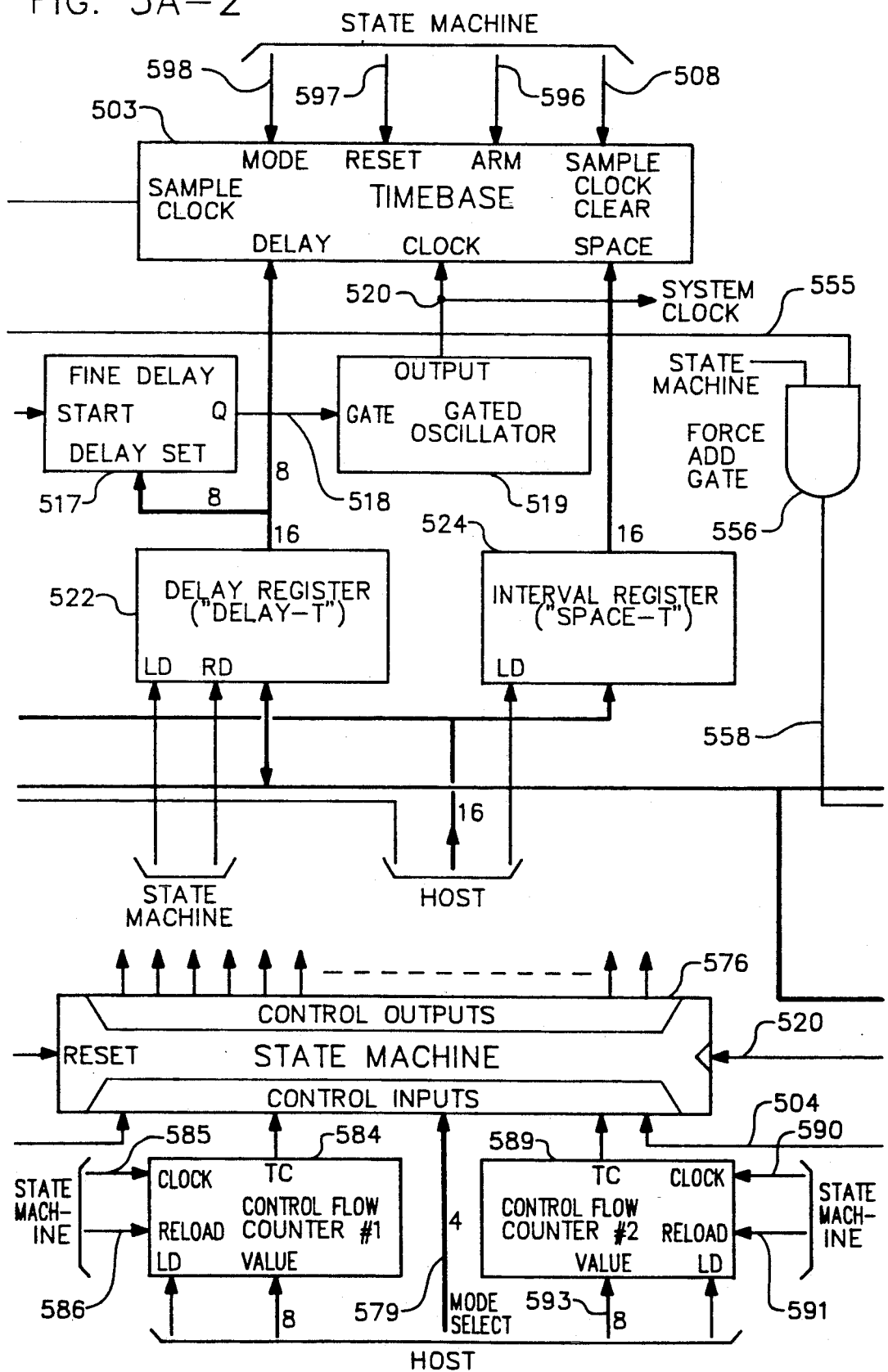
Figures 3, 5A:
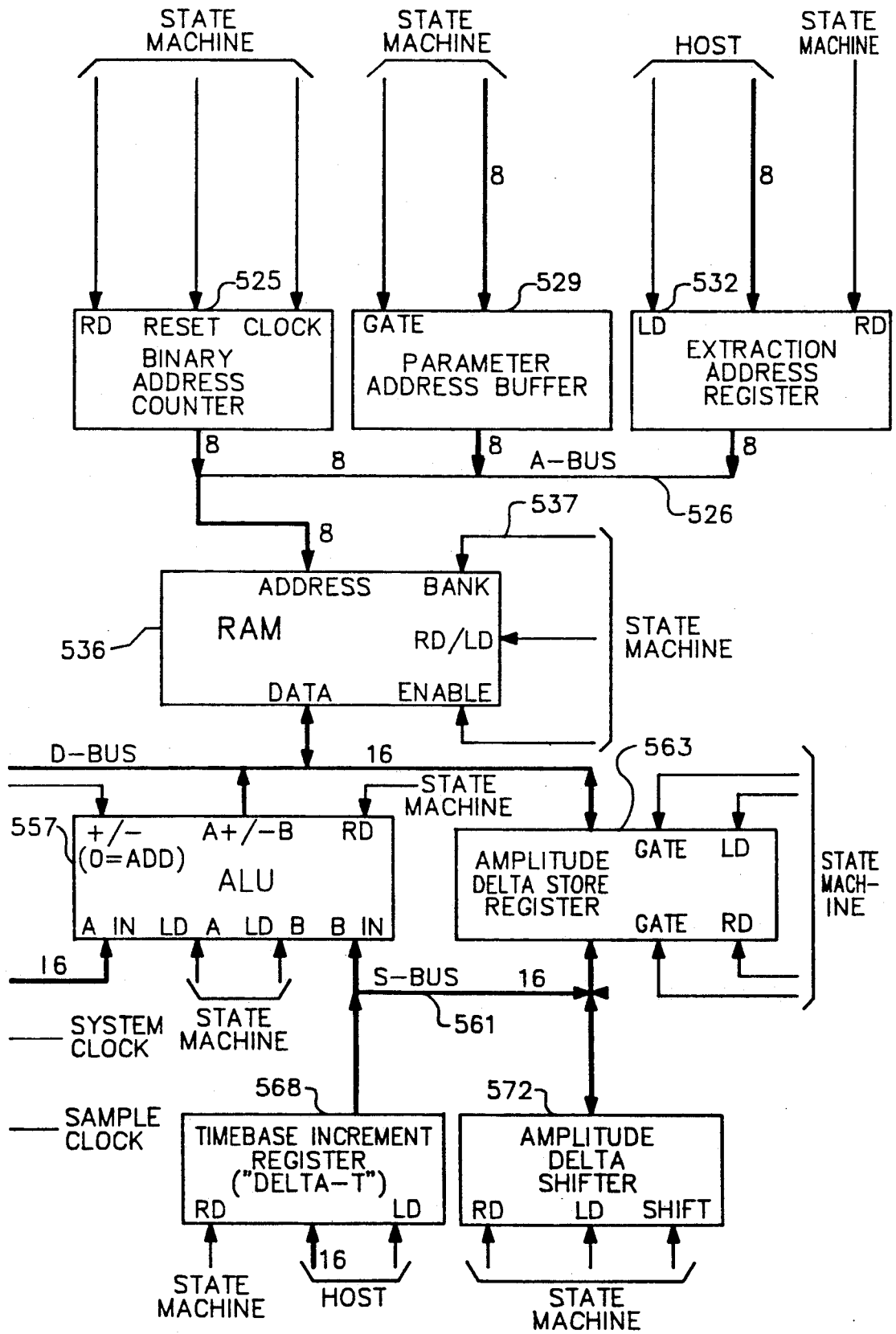
Figure 5B:
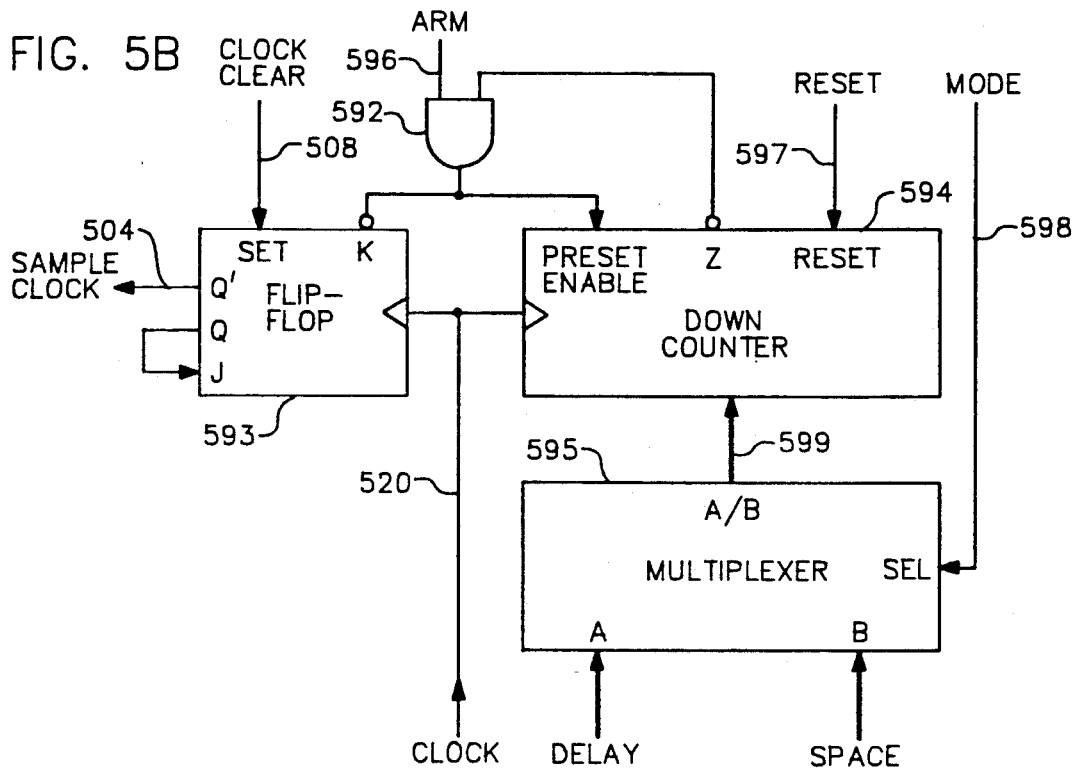
FIG. 5B details the logic circuitry for a timebase component of the embodiment (Method 1) corresponding to FIG. 1 and part 5A of FIG. 5A.

FIG. 5B shows one implementation of a timebase circuit capable of providing all of the timebase operating modes described herein. The principle element is a digital down-counter 594 which is clocked by system clock 520. The counter is initially loaded under state machine control via arm line 596, which causes the data present on data bus 599 to be synchronously loaded into the counter when a system a system clock edge occurs. The Preset Enable input is fed the arm signal via an AND gate to accomplish this function. Alternatively, the counter could be simply reset to zero by control line 597 if so desired. A mode line 598 controlled also by the state machine dererrnines which data is fed to the counter: a choice of delay-t or delta-t is possible, depending on the desired mode of operation. A final flip-fope 593 provides the sample clock signal 504; the configuration of this flip-flop permits only one transition of the clock signal 504 to occur, synchronous with clock line 520, and only when the output of AND gate 592 is low. This may occur when either the arm signal 596 or the zero detect line output of the counter are low. The state machine may, however, override the generation of a sample clock by setting clock clear line 508 high; this is always done simultaneous with the asserting of arm signal 596 to prevent the spurious generaton of a sample clock.

The timebase of FIG. 5B functions in delay-t mode as follows: With the system clock 520 running due to either the force-run flip-flop 516 state being set or due to a triggered condition, the state machine 576 forces the initiation of delay-t operation by simultaneously asserting clock clear line 508, arm line 596, the mode line 596 to select the delay-t data path, the force-run flip-flop reset line 545, and the holdoff clear line 514. On the very next rising edge of clock 520 following these assertions, the counter 594 will be forced to preload the delay-t value fed to it by data multiplexer 595 on bus 599. At the same time, flip-flop 593 will be set, forcing sample clock line 504 low. The 'Z' output of counter 594 will immediately go high on this next rising clock edge of 520 if the delay-t value loaded is non-zero. This same clock edge will also cause the state machine to advance to the next state, which is programmed to de-assert every one of the control lines mentioned above for the preceding state. At this point, the system clock 520 stops, bringing the state machine, timebase, and all other subsystems to a halt. On the next trigger event following this action, clock line 520 begins to clock once again. Counter 594 begins to count down, and continues to do so until a zeo count is reached. At this point, the 'Z' output goes low, causing the flip-flop 593 to toggle on the next clock edge of 520, creating the required sample clock edge on line 504 by a transition from low to high on line 504. The state machine, although receiving system clocks on 520 during the delay-t period from the start of these clocks until the edge on 504, is programmed to not advance to the next state until it detects that line 504 has gone high. Line 504 is also an input to the state machine. It is also important to recall that the total delay includes the delay generated by the fine delay generator 517. In this manner, a digitally programmable delay interval is created to delay a single sample point from a trigger or synchronizing point.

The creation of multiple sample points referenced in time from a trigger or synchronizing point is accomplished by having the state machine 576 assert the clock clear line 508 for one cycle of system clock 520, and setting the mode line 598 to feed the value space-t to the counter; the timebase sample clock output 504 is thus cleared, and the timebase 594 is then preset with the value space-t on the following clock edge. The state machine is programmed to wait once again until it detects that line 504 has gone high; at this point, a sample clock is generated. By repeating this process, a mulitple number of sample clocks may be generated following a single trigger or synchronizing event; by combining this sequence with the actions described for the generation of an interval delay-t, a multiple number of sample clocks may be obtained following a delay interval, with the spacing between sample clocks being a programmable multiple of the clock period of 520.

In the design of such timebases for a particular application, other approaches may be employed to achieve a similar result, or elements of the described circuit may be eliminated if some of the features are not required. Such variations and modifications will become evident to the practitioner of the art in the course of design, and are to be considered within the scope and spirit of the invention.

Four primary Modes of operation of the circuit are possible, which may be broadly classified as follows. The examples assume that the resulting data is to have an 8 value final resolution in a 16 bit space, and that 256 temporal data points are to be acquired, although the methods may be generalized to include other resolutions and acquisition legths:

1. ("Mode 1") A Mode whereby real time acquisitions are obtained by virtue of multiple sample clocks on line 504 per waveform repetition, such that all points along the waveform of interest are acquired sequentially and within but one repetition of the input signal. In this example, $8 \times 256$ sample clocks on 504 are required for the completed conversion, in only one waveform repetition.

2. ("Mode 2") A mode whereby only partial acquisitions are obtained of each desired sample point during each waveform repetition by virtue of multiple sample clocks on line 504 per repetition, such that all data points of interest are sampled at least once each repetition by clock 504 and flip-flop 502 but less than the required total number of samples to complete the acquisition.

In this Mode at least 256 sample clocks occur per waveform repetition, each sample clock representing one eighth of the total required number of sample clocks at the temporal points where they occur; if in fact only 256 sample clocks occur per waveform repetition, eight waveform repetitions are then required to complete the conversion. On the first waveform repetition, the MSV's of each of the 256 data points will have been acquired; on the second repetition the next significant value, etc.

Another example of this Mode would involve two waveform repetitions, whereby the four most significant values would be acquired in the first repetition (requiring $4 \times 256 = 1024$ sample clocks) and the last four in the second and final pass.

Yet another example occurs when four repetitions are required, whereby the two most significant values would be acquired in the first repetition (requiring $2 \times 256 = 512$ sample clocks), the second two values in the second pass, the third se set of two values in the third pass, and the final set in the fourth pass.

Thus there are three timebase settings which can use this Mode of operation using convenient binary increments of required passes and sample clocks.

3. ("Mode 3") A Mode whereby partial acquisitions are obtained both in terms of values and number of data points. In this case multiple sample clocks on 504 are required per repetition, but at most only one value of each data point to be acquired is sampled, and less than the full number of sample points are generated per repetition.

This Mode differs froms the previous Mode principally by virtue of requiring interleaving of sample clocks in time between successive groups of waveform repetitions, and by restricting the number of clocked values per repetition to one per point.

For example, if only 128 sample clocks are issued per repetition, then only half of the required data points can be sampled with each repetition and only for one of the eight values each time. Assuming that these 128 data points are interspersed with the remaining 128 data points, then during repetition number 1, temporal points 0, 2, 4, 6 etc. may be sampled to determine the MSV of each. On repetition 2, the same sample points are sampled again to determine the next most significant values. Eight repetitions are needed to fully acquire the first set of 128 interspersed data points. The remaining 128 data points are similarly acquired, except that the sequence begins with temporal points 1, 3, 5, 7, etc. Thus in this example, $2 \times 8 = 16$ waveform repetitions are required.

In another example, if the timebase setting is such that only two sample clocks per repetition are possible, then on pass 1 points 0 and 128 may acquired for their MSV's; these two points are sampled fully after 8 waveform repetitions. Repetition 9 would begin by sampling for the MSV's of points 1 and 129. A total of $(256/2) \times 8 = 1024$ repetitions are needed to acquire the entire waveform at this timebase setting.

There are seven possible timebase settings of Mode 2 employing binary multiples of sample clocks, ranging from 2 clocks per repetition to 128 clocks per repetition.

4. ("Mode 4") A mode whereby only one sample clock is geneated for each waveform repetition, and the sample clock is repeated at a specific temporal point on successive waveform repetitions until all value levels for that point are determined; the timebase is then set to sample at a new such temporal point, and the nest point is similarly acquired. The process repeats until all desired waveform points are acquired.

As an example of this Mode, point 0 may be acquired in the first eight repetitions to all its value levels; repetition 9 might then begin with the MSV determination of point 1. Repetition 17 could begin conversion of point 2. A total of $256 \times 8 = 2048$ repetitions are required to convert the waveform.

Although it would normally make sense to acquire points in linear temporal succession, i.e. one point following another from left to right as on a display, it is entirely possible to acquire points in any desired order according to an arbitrary algorithm.

There are any number of timebase settings possible in this Mode, to the limit of temporal resolution as determined by the fine delay capability of delay circuit 517. An effective temporal sample spacing on the order of a few picoseconds is entirely feasible without significant modification.

This Mode differs from Mode 3 principally in having the number of sample clocks per repetition limited to one.

It is important to understand that the above are Modes of operation that may be implemented in a variety of hardware architectures; in particular, all four Mode apply to any of the Methods, and can be made to apply at least in part to other unrelated or tangentially related acquisition methods as well.

A waveform diagram of Mode one is shown is FIGS. 6A and 6B. Here, a single continuous signal is acquired in one cycle; the point labelled t3 is shown to be acquired in real time in an expanded view in FIG. 6B. The successive approximation process occurs without benefit of a sample and hold by making use of eight sample clocks labelled T3.0 through T3.7 for each data point being acquired. The final digital value for each such data point will be representative of an analog value lying between the prior 8 sample clocks (T2.X) used to determine the previous point and the succeeding sample clocks (T4.X).

Timebase 503 must issue multiple sample clocks on line 504 during each repetition for this Mode to operate. In fact, since 8 sample clocks per point are required, $8 \times 256 = 2048$ total clocks must issue on line 504 during the course of one waveform repetition. The spacing between these clocks will vary depending on the timebase setting; this spacing (space-t) is set by the contents of register 524 which is loaded by the host.

The timebase is controlled at the beginning of the acquisition process to delay "delay-t" time according to the value initially loaded into register 522. Since this delay is like a fixed delayed sweep timebase, its value does not typically vary from one waveform repetition to the next, but may be made to vary if different delayed sections of the waveform need to be sampled. Its value may of course be zero if an absolute minimum of delay is desired. Subsequent to the first delayed sample clock, the remaining 2047 sample clocks are issued by the timebase in succession, spaced space-t clock cycles of 520 apart. State machine 576 resets to logic zero the sample clock signal between each such sample clock by a signal on sample clock clear line 508; as shown, sampling of the signal by flip-flop 502 occurs on the rising edge of clock 504.

A waveform diagram of one of the Mode 2 settings is shown in FIGS. 7A and 7B. The waveform sections shown here coincide with the interval between t3 and t4 as shown in FIG. 6A. For explanatory purposes, FIGS. 7A and 7B replace FIG. 6B, still subtending the overall waveform of FIG. 6A.

The Mode 2 of FIG. 7 shows a two-repetition acquisition; both required repetitions are shown, making use of four clock intervals per data point to fulfill the required total of eight clocks per analog sample. This waveform diagram could also have shown the use of two clock intervals per point and four input waveform repetitions or one clock interval per point and eight repetitions.

It is of great importance to realize that in Mode 2 the data points are acquired in a fragmented way. After clocking point T3.3 only four of the required eight clock samples will have occurred, following which t4 will need to be clocked. Obviously t3 cannot complete while t4 is also being acquired. The result of clocking point T3.3, the value 73.5, must be saved and then later restored on the second repetition after point T2.7. This saved and restored intermediate value is referred to as a data fragment. At the end of the second repetition, after T3.7, the final value is determined and is saved in RAM. Other settings of Mode 2 require more repetitions, and hence the saving and restoring of more data fragments.

In the described system, memory 536 is used for data fragment storage. The state machine can access memory 536 in such a way that on fragment passes the data fragments are stored in a special bank of memory locations. On the last pass, the data fragments are restored both to the ALU 557 as well as the DAC 540. Final values are determined and stored in a memory bank in 536 reserved for completed data. As the first pass requires the loading of the DAC with the seed value prior to each data point clock (as shown in FIG. 7A, just prior to T3.0), no fragments need be initially restored from memory. If desired, fragments could have been saved in a separate memory device separate from the final data memory.

As in Mode one, the timebase in Mode 2 must be capable of providing first any desired delay-t, plus a train of sample clock pulses of desired spacing space-t. The operation of the timebase in Mode two is identical to that of Mode one, except that the total number of sample clocks per repetition in this example may vary from 256 to 1024 depending on the timebase setting. Neither delay-t nor space-t need to change during the course of acquiring a waveform.

A Mode three timing diagram is shown in FIGS. 8A and 8B. 128 sample clocks per repetition are shown, but this Mode can have as few as 2 sample clocks per repetition (if timebase increments of 128 are used). As shown in FIG. 8A, the waveform is sampled at the points t0, t2, t4, t6, and t254; the sampling at these points repeats a total of eight times, requiring eight input waveform repetitions.

In FIG. 8B, the next set of points are acquired at t1, t3, t5, t7, t253 and t255, again by sampling eight times for each point using eight total repetitions. The time between all sample points in both FIG. 8A and 8B is determined by space-t; in this case, space-t=2. To sample first a sequence of points starting at t0 and then at t1, the timebase delay-t needs to be incremented with delta-t prior to each group of 8 waveform repetitions; in FIG. 8A delay-t is zero, and in FIG. 8B delay-t is half that of space-t.

As with Mode 2, the data points are acquired in a fragmented fashion. In progressing from one data point to the next (after the first repetition), the DAC 540 and ALU 557 must be set to contain always new sets of data fragments; after each sample clock the data fragment from the clocked point must be stored in the special memory bank, and the prior fragment for the next point must be retrieved.

Mode 3 differs from mode 2 primarily in that the use of a variable delay-t must be made between repetitions. Also, all Mode 3 settings convert only one value "fragment" per data point with each pass, although the fastest Mode 2 setting also converts only one fragment per data point.

A Mode 4 timing diagram was previously shown in FIG. 2. Here a single sample clock per repetition occurs, which is repeated eight times during eight repetitions to acquire data point t3. After the data point is acquired, the timebase parameter delay-t is altered by adding delta-t to delay to the next data point t4, and the process repeats. Data is not fragmented in this Mode prior to any memory storage step, or at least it is not necessary that it be fragmented, since all 8 values for each point are acquired in sequence without interruption, even though 8 waveform repetitions are required to do this. Therefore, accesses to the special intermediate memory bank are not required in this Mode. Delayed timebase action may be accomplished in a manner identical to the other Modes, by the setting of a nonzero initial value of delay-t. Delta-t is simply added repeatedly to the base value of delay-t to generate the required temporal spacings for the sample points after each group of 8 sample clocks. Space-t is not required at all in this Mode, since multiple sample clocks per repetition are not generated.

Figure 9:
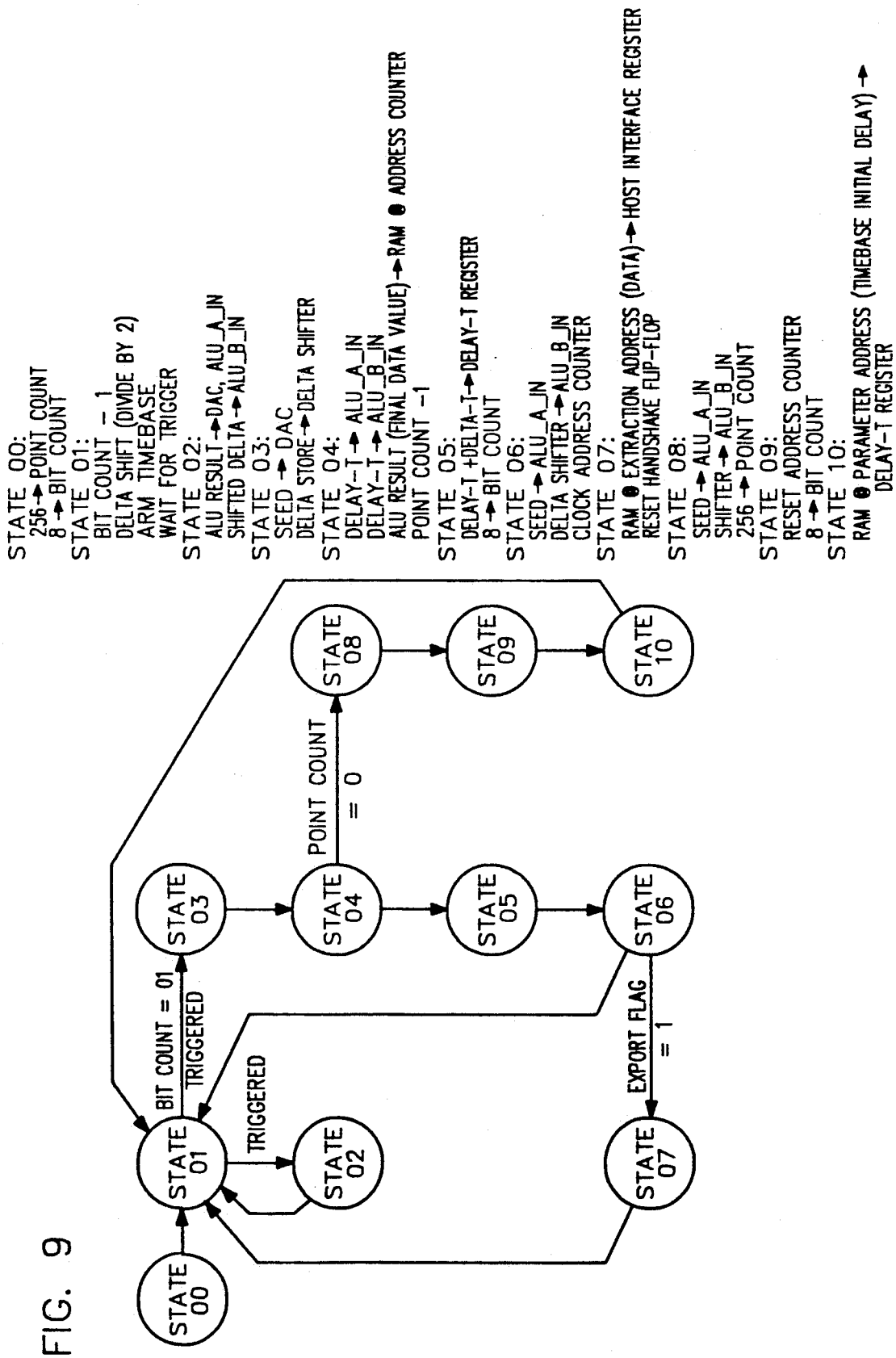
FIG. 9 details a state flow diagram for one of the exemplary modes (Mode 4) of the state machine component in the embodiment of FIGS. 1 and 5A.

A state flow diagram of Mode 4 as used in conjunction with Method 1 is shown in FIG. 9. The other Modes bear some resemblance to this flow diagram as well, but obviously differ in a number of substantial aspects relating to the repetition and interleaving of sample clocks, and the storage and restoring of data fragments.

The need for the different Modes and the reason why they switch among one another at different effective acquisition speeds can be understood better by realizing that the DAC 540 and the associated circuitry used to digitally load the DAC have associated with them a finite delay and settling time ("delay path") after the comparison in the comparator 501 is made. The different Modes are all designed to run this delay path to its maximum speed limit, regardless of the effective acquisition rate. Thus, at slower timebase settings the delay path can be used to convert signals in real time. At increasingly faster timebase settings the acquisition process is purposely fragmented first in SAC sequence and then at even higher rates in temporal sequence. In this manner the highest possible acquisition rates are maintained for a given delay path limit, without the need for sample and hold circuits and the attendant abrupt decrease in sampling efficiency when real time rates have been exhausted. The technique also integrates well with the ability to manipulate the DAC range and offset through any of the Methods to achieve amplifier-less and attenuator-less gain and offset control.

An underlying assumption of Modes 2, 3 and 4 is that the input waveform does not change significantly between repetitions. However, if the signal value corresponding to a data point does change, the process will tend to track the changes either if the change occurs during the eight successive clocks required for each data sample or if the signal changes between successive fragment passes. There is nothing in the process which can make the resulting data become errant from the range of values occurring in the input signal as it changes.

It is possible to design the state machine so that it will cause the system to track peak to peak readings of randomly varying signals. For example, an upper peak may be determined by tracking each data point by an upward-ratcheting only algorithm that deviates from normal SAC algorithm methods. Similarly a negative valley point may be determined by the use of a downward-ratcheting algorithm. The display of a peak-to-peak envelope may be implemented by employing both methods alternately for each data point or alternate data points. The ratchet mechanism may simply involve the addition or subtraction of only a single delta value to the seed value to determine peaks; the delta value should be small, corresponding to an amount comparable to the LSV of the conversion. If the output of the flip-flop is a logical one after a sample clock, then to determine a peak reading the delta would be added. If the flip-flop state was a zero, then nothing would be either added or subtracted. Similarly a valley can be found by subtracting only. A relaxation factor may be desired, where after reduction of the signal amplitude the acquired data relaxes to conform to the new, smaller envelope. This can be implemented in the algorithm as an occasional resetting of the data or as an occasional but forced countervailing addition or subtraction. Another method for achieving relaxation would involve a countervailing addition or subtraction only if a fixed number of zero additions or subtractions were to occur in sequence, indicating a probable collapse of the input signal.

Figure 3:
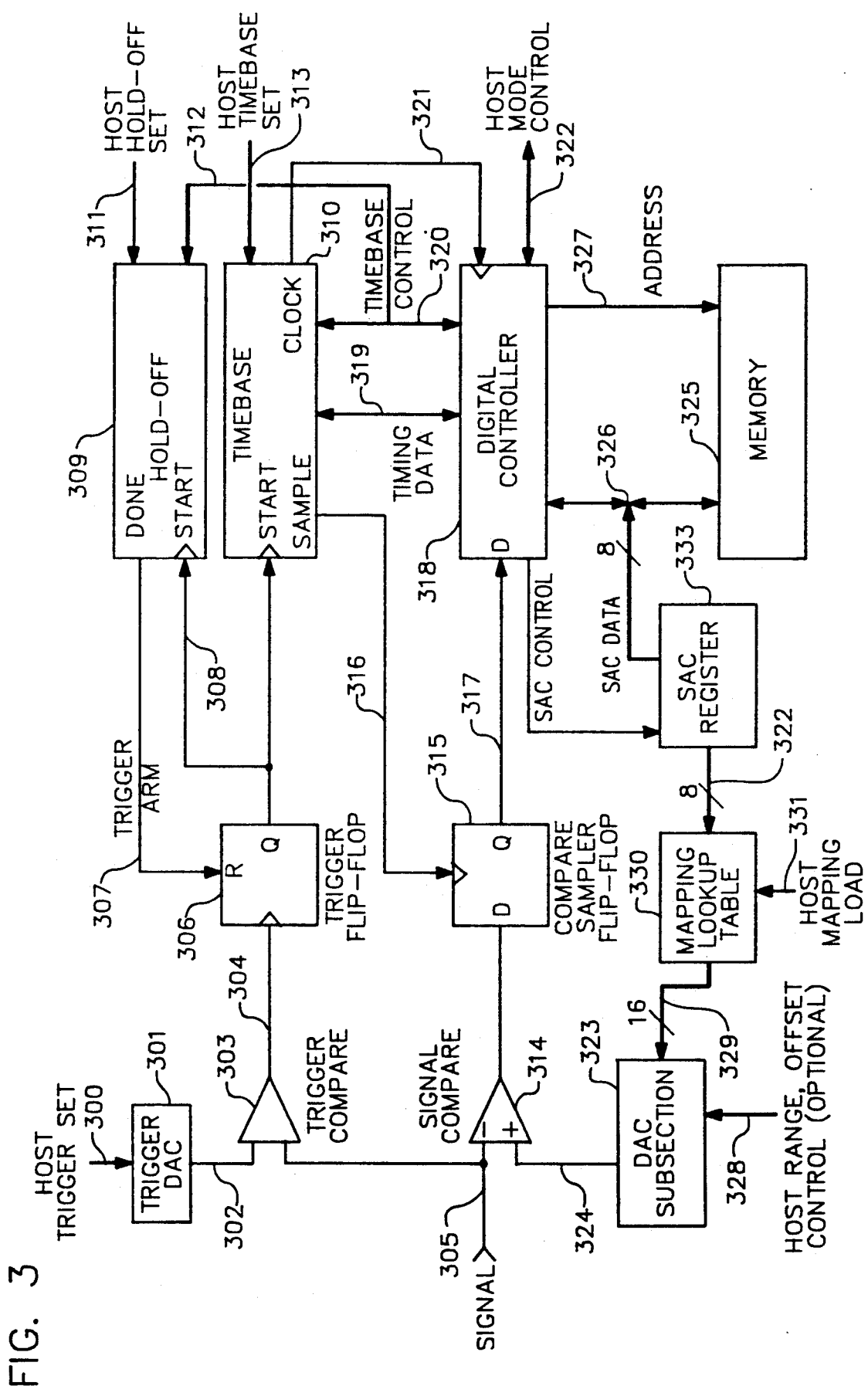
FIG. 3 shows a general block diagram of an embodiment employing VSAC Method 2, wherein a lookup table and a SAC register are used to control a relatively wide dynamic range DAC to perform a variable range and offset conversion process.

FIG. 3 shows a block diagram of a system employing Method 2. In this system, computations are performed by a host computer prior to acquisition to fill a lookup table 330 with values that transform or map an ordinary 8-bit SAC process into an 8-value process in a 16-bit space. The DAC subsection 323 may optionally have its gain and offset controlled by the host for added flexibility.

Figure 10A:
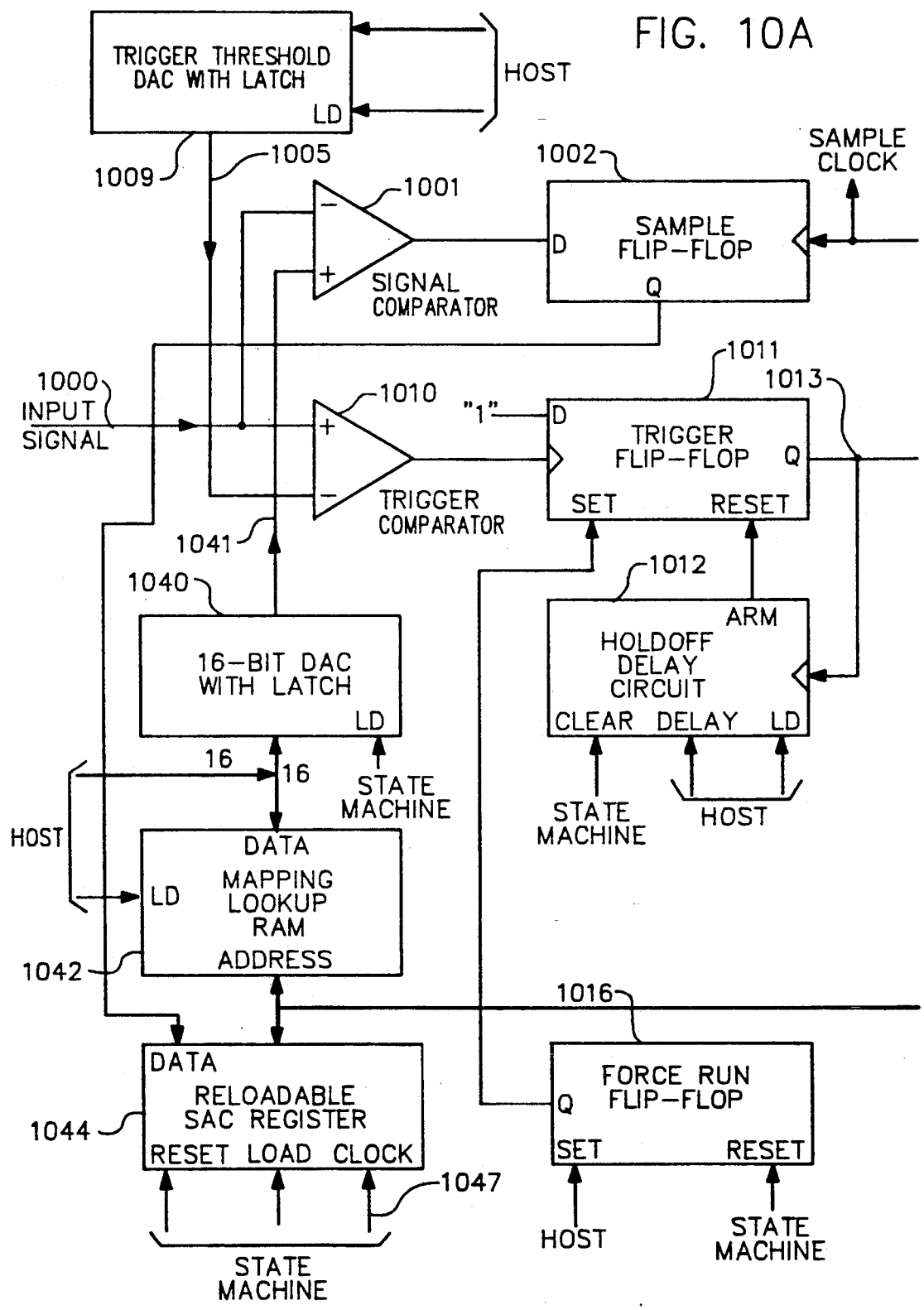
FIG. 10 consisting of parts 10A, 10B and 10C show; the detailed internal block diagram of the embodiment of FIG. 3 using the techniques of Method 2.
Figure 10B:
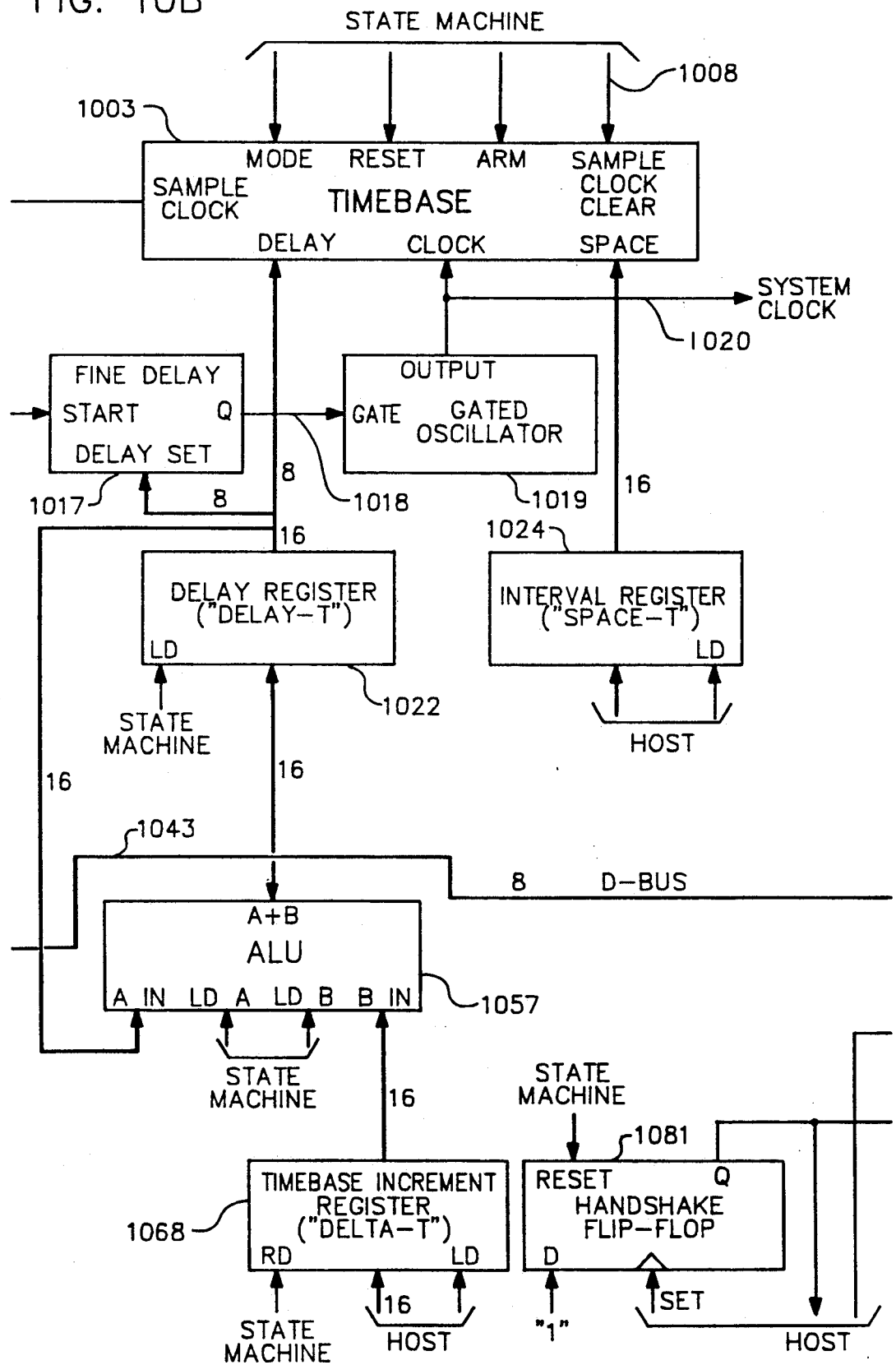
Figure 10C:
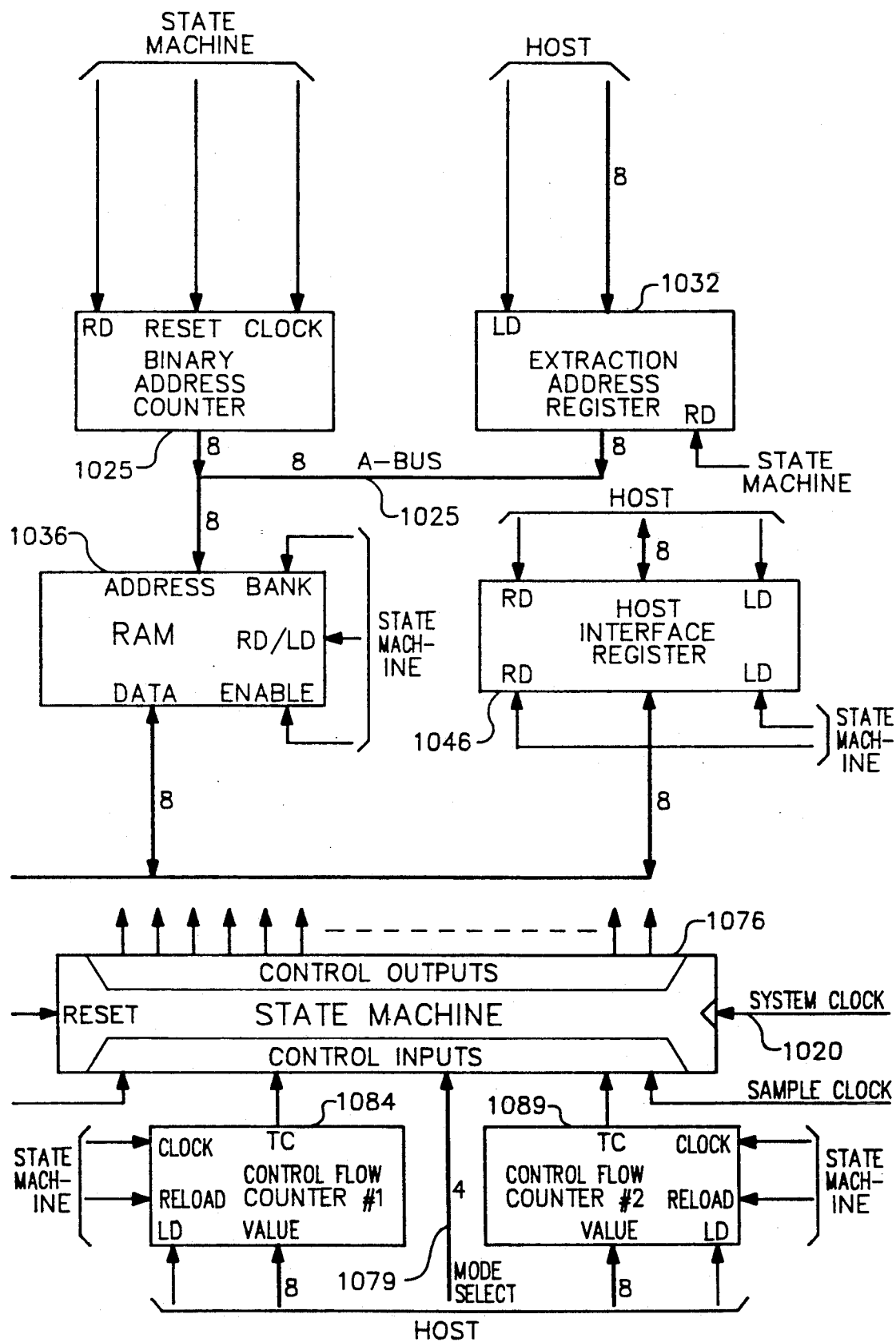

FIG. 10 details the internal structure of Method 2 as outlined in FIG. 3. The 16-bit DAC 540 of FIG. 5A is still preserved (1040), but the DSP control hardware is dramatically simplified, to the point where it may be termed simply a "Digital Controller" (318). The timebase and holdoff sections remain essentially unchanged from Method 1, including the use of a fine delay generator 1017, a gated oscillator 1019, and a force-run flip-flop 1016. The timebase 1003 still employs a delay-t register 1022 and a space-t register 1024 for its operation in the various Modes. An ALU 1057 is still needed, but only for updating the timebase delay-t value as described in conjunction with FIG. 5A. An A-bus 1026 is still employed to allow address counting and the extraction of data from the memory, but parameter addresses are not required and so a parameter address buffer 529 is not used. A special successive-approximation register 1044 is used to access lookup table 1042 which in turn drives the DAC 1040.

In this Method, as previously described, the Host must load lookup table 1042 with values that correspond to each possible DAC 1040 value that may be encountered during the conversion process. Relating to a previous example as described in conjunction with FIG. 2, location 0 of the lookup table 1042 would contain the value '49', and location 255 would contain the value '95'. The other locations would contain linearly interpolated intermediate values computed to lie between 49 and 95. In certain applications lookup table 1042 may be replaced with a read-only memory ("ROM") or a programmable logic device ("PLD") which performs the value conversions in a fixed manner, or perhaps incorporating a number of fixed but selectable conversions.

SAC register 1044 is of a special construction that permits reloading of its state for proper operation with Modes 2 and 3. These Modes require the saving of "data fragments" between temporal sample points, and the reloading and subsequent processing of these fragments after other data points have been partially acquired. Accordingly, FIG. 10 shows a line labelled "Load" associated with register 1044 for restoring a saved fragment from RAM 1036. The line labelled "Reset" permits the resetting of the register 1044 to the initial state prior to an initial conversion clock.

Figure 11:
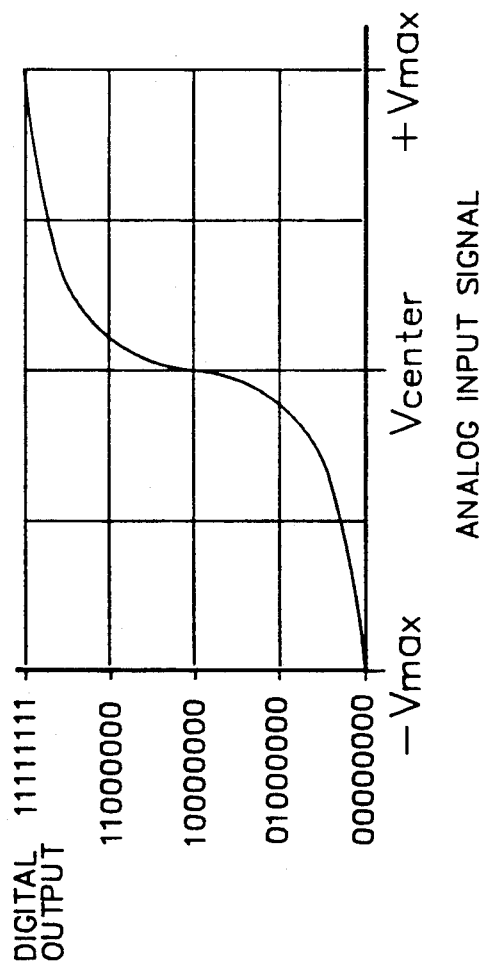
FIG. 11 describes the relationship of input signal amplitude to encode digital output when a Method 2 converter is used to implement a companding type ADC.

A modification of Method 2 incorporates the use of nonlinear lookup table entries, in order to transform the input signal into a new representation. For example, if the lookup table 1042 incorporated a divergently expanding non-linearity centered at the center signal level, a form of signal compression would occur with the center sections of the signal (i.e. about the center point) being resolved to a higher resolution than the outer sections. Such transformations are commonly found in telephony, for example in u-law companding ADC's. An example of the transfer characteristic of such a converter is shown in FIG. 11. While a RAM-based lookup table is useful for changing the various conversion characteristics "on the fly", a dedicated ADC employing such a principle may have the lookup table embodied in a ROM or PLD as previously described. Other transformations involving signal expansion or compression, the nature of which are application dependent, are easily incorporated into the lookup table. The transformation can be made to occur in any of the Modes previously described, but in the case of dedicated ADC's such as found in telephony Mode 1 operation will be most useful.

Method 2 state flows are similar to those used for Method 1. In particular, the control actions relating to timebase control are identical to those for Method 1, while the state actions relating to DAC control are simplified since arithmetic operations are not explicitly required for successive approximation computations.

Figure 12A:
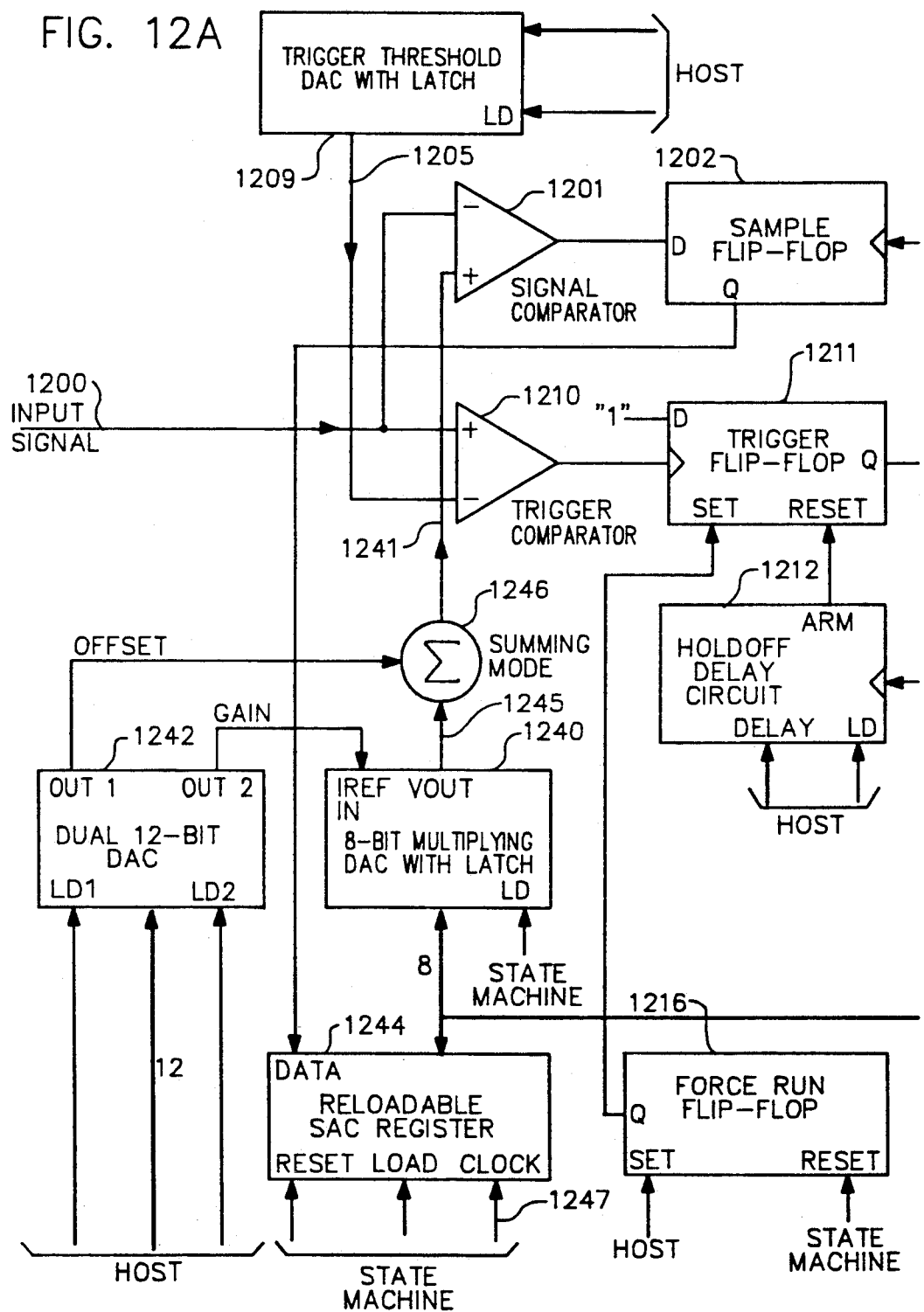
FIG. 12 consisting parts 12A, 12B and 12C show the detailed internal block diagram of the embodiment of FIG. 4 using a Method 3 converter technique.
Figure 12B:
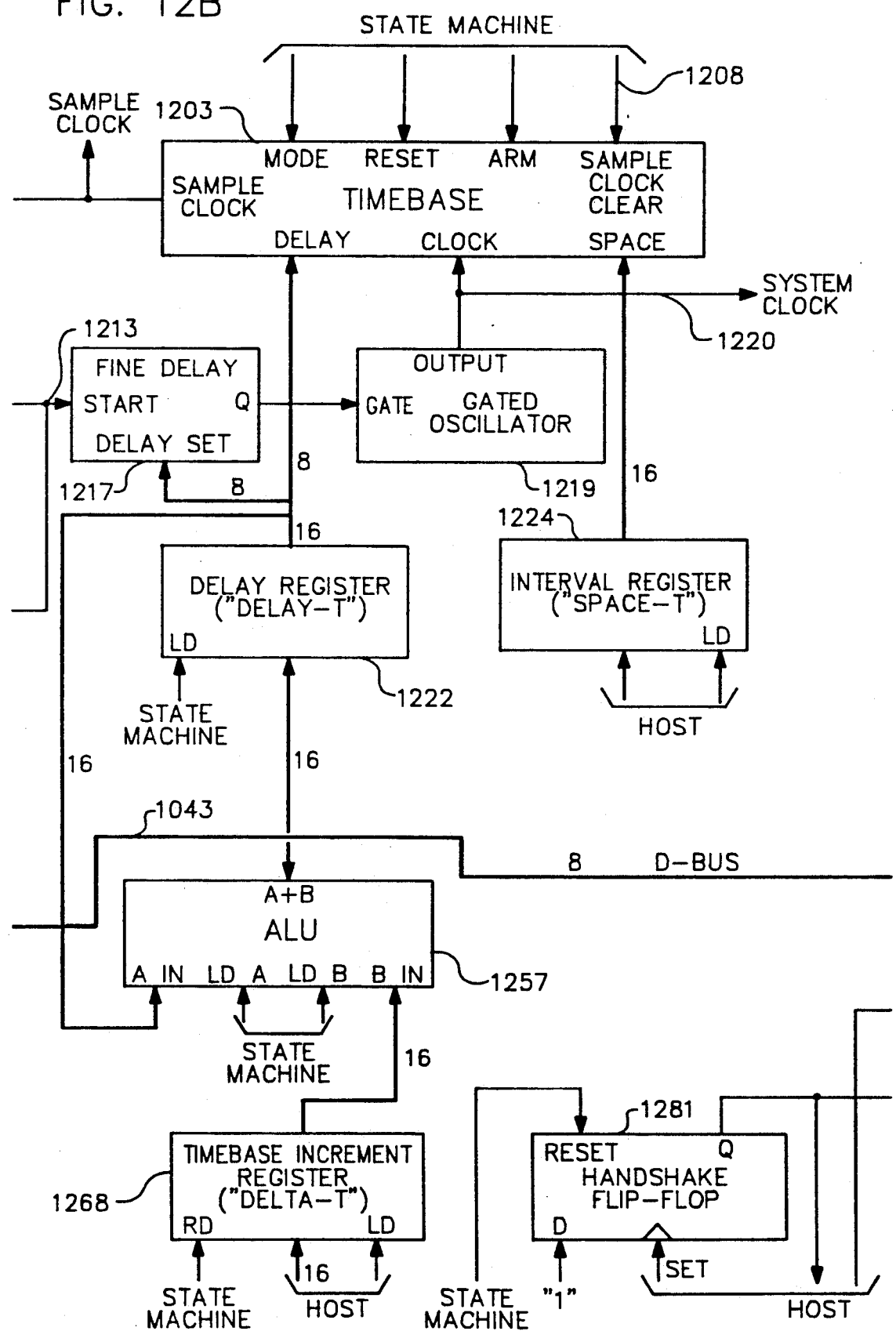
Figure 12C:
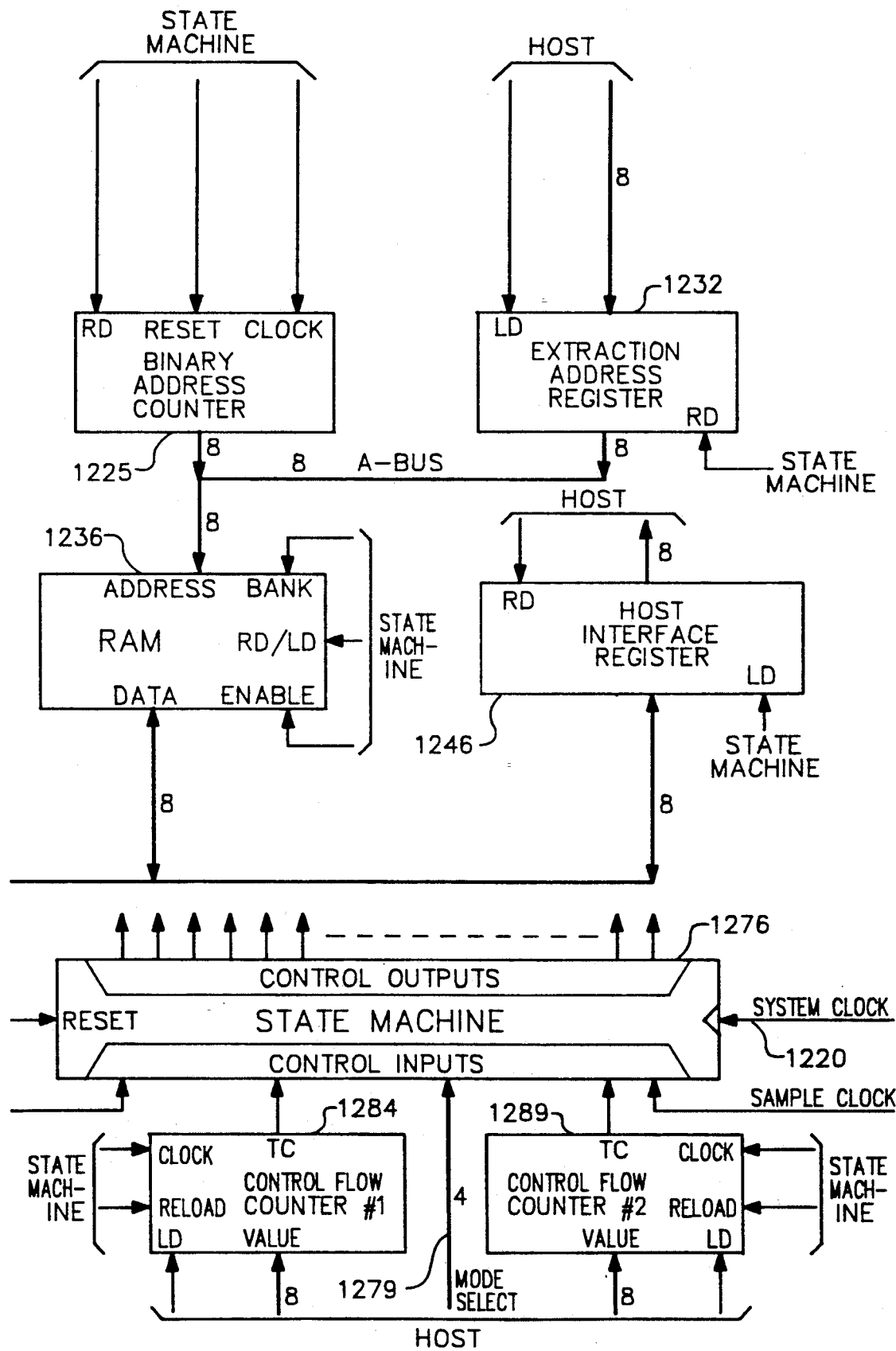

FIG. 12 shows a block diagram of a system employing Method 3. This system is extremely similar in function to Method 2, except that the DAC 1240 is of only 8 bits resolution, and its output is scaled and offset in a controlled manner to cover the signal range of interest. This control is achieved with the use of a dual DAC 1242; a 'gain' analog level fed to the multiplying input of DAC 1240 is used for setting its range, while an 'offset' analog level fed to summing junction 1246 is used for settig its DC center level. The dual DAC is set directly by the host processor, and does not require state machine intervention. These secondary DACs should have good resolution, but it is not necessary for them to have high speed. For most applications a single 12-bit DAC with multiplexed outputs may be used together with a digital demultiplexing subsystem for 1242. Another inexpensive approach is to use two filtered pulse-width-modulated (PWM) outputs of a dual timer circuit having an appropriate dynamic range. The only parts requiring generally fast operational speed are the DAC 1240 and the summing node 1246 at the output of the DAC.

Some types of DACs which might find use for function 1240 have little or no usable dynamic multiplying range. In such cases, a separate analog multiplier can be used between the DAC 1240 and the summing junction 1246. In certain cases the dynamic range of 1240 may only require augmentation; a switched voltage or current divider under host control following 1240 can often provide the extension of dynamic range necessary.

The successive approximation register 1244 used in FIG. 12 can be the same as found in FIG. 10 (1044). Also, the state control code for Method three is nearly indistinguishable from that used for Method 2. Timebase control is identical with Method 1 as it is with Method 2, and SAC register control is identical with that required for Method 2. Method 3 state code differs from Method 2 only in the requirement of Method 2 to permit host access to the lookup table RAM 1042 to load and alter the lookup values.

In any of the Methods, multiple channels of input signal may be incorporated by using two or more input comparators and selecting one of the comparators at a time during the conversion process. Channel interleaving may be accomplished by either the "chop" or "alternate" methods commonly employed in oscilloscopes; in chop mode, the acquire hardware alternates data points between channels and stores each channel's data points in a unique bank of digital memory. In alternate mode, the hardware acquires all data points for a complete trace for one channel before switching to the other channel.

It is a simple matter for Methods 2 and 3 to be modified to acquire in "dual beam" mode without alternating or chopping. Two SAC registers identical with 1044 are used, one per channel, both being clocked in tandem but having data coming from their respective input comparators. Two memories 1036 are used with two independent data busses, and two access registers 1046 are used to extract the resulting data values to the host computer. The A-bus 1026 can be common to both memories. This technique also requires that two DAC's 1040 or 1240 be used for either Method. Further, in the case of Method 2, two lookup tables 1042 are needed. In the case of Method 3, two dual DAC's similar to DAC 1242 (or a single quad DAC) are also required. In any of the variations described above, more than two channels may be employed by simple extensions of the techniques described.

While the Methods all achieve a similar result, there are advantages, disadvantages, and varying opportunities for special modification of each that will determine the variation to be employed in a given application.

Method 1 for example requires the implementation of a sophisticated DSP type computing structure to drive the conversion DAC; it is also in general slower to convert than the other Methods. But Method 1 also allows for variable value resolution without requiring a physical change in the hardware. For example, although 8-value (i.e. 8-"bit") conversions were previously described, the same system could convert signals to a full 16 values of resolution (assuming a 16 bit DAC is used), provided that the proper seed and delta parameters were loaded and the right state machine code was incorporated. A proper design of this type can implement any value resolution desired, from single value conversions to the limiting bit resolution of the DAC.

Single value conversions have application for logic signal acquisitions, for example, as will be discussed later herein. The DAC 540 of Method 1 can also be modified to have an output that is further scaled and offset in a manner similar to Method 3 if even more dynamic range is desired. The value of such flexibility lies in the ability of the system to dynamically trade of speed versus resolution, depending on system requirements and signal characteristics.

Another advantage of Method 1 is its ability to easily incorporate other acquisition mechanisms, such as delta conversion, peak and valley detection, hard-limit filtering, high speed signal averaging etc. simply by incorporating the proper state machine code and perhaps by making minor modifications to the hardware. As a novel example of one such variation, Method 1 hardware can be modified and programmed to accommodate variable gain and offset conversions along a single waveform, for example to track the amplitude of the decaying signal of an optical TDR over an extremely wide dynamic range. While the other Methods can be modified to perform similar functions, such flexibility comes more naturally to Method 1.

A drawback of Method 1 is the occurrence of truncation errors in the computation of comparison values for the setting of the 16-bit DAC. As the shifter 572 divides the delta value, the LSB's are shifted out and truncation occurs. This becomes a problem if signal values are small and hence delta values are small; in this case the truncated bits can cause singificant conversion errors, resulting in non-monotonic results. However, the system can be expanded to more bits of resolution to alleviate truncation error, and delta values (when small) may be restricted to having zeros in their lower order bits so that the truncation effect becomes reduced.

Method 2 is much simpler than Method 1, and unlike Method 3 does not require as much analog processing at the output of the conversion DAC. However, it is still typically slow in comparison to Method 3 since it requires a relatively slow high resolution DAC. It is also relatively difficult to make Method 2 perform some of the other acquisition mechanisms described for Method 1, since direct access to the full resolution of the DAC is lost along with the ALU required to perform mathematical operations necessary for those mechanisms. Method 2 may be modified for variable value resolution conversions similar to that possible for Method 1, by employing a larger lookup table 1042 with a SAC register 1044 having enough bits to accommodate the highest desired resolution. At the highest resolution, the table 1042 must have at least 2 n entries where 'n' is the number of total bits in SAC register 1044, and where the table 1042 has a data width composed of the same number of bits as used by DAC 1040. Lower resolutions than the highest possible may be selected by simply feeding a lesser number of SAC register clocks on line 1047 than there are bits in the register, i.e. by having the state machine prematurely terminate the SAC conversion process. Like the variable value resolution modification in Method 1, conversions may then be limited to a single value or any number of values up to the limit of SAC register 1044.

Method 2 has a further advantage over Method 1 in that truncation errors can be easily prevented. During the computation process by the host to determine the values used to fill the lookup table, appropriate numerical techniques (such as rounding) can be employed to prevent truncation errors as may occur in Method 1.

Method 3 is nearly as simple as Method 2 and is potentially much faster by virtue of its lower resolution DAC 1240. Method 3 has an additional advantage in that the gain and offset acquisition parameters may be varied by the host processor without intervention into the acquisition process itself, i.e. without requiring the state machine to suspend acquisitions as it loads in the new parameters from the host. In general Method 3 still retains the lack of acquisition flexibility associated with Method 2, however it too may be modified to permit variable acquisition value resolution. As in Method 2, SAC register 1244 may be expanded to include the maximum number of desired bits; DAC 1240 must then also be selected to have at least the same number of bits as the SAC register. In conjunction with the range and offset settability of the DAC 1240, a modified Method 3 is capable of considerable acquisition speed and flexibility.

Like Method 2, Method 3 does not suffer from truncation errors. Since gain and offset variations are accomplished in an analog subsection, effectively through a process of analog multiplication and addition, there are no sources of non-monotonicity except as might be found in DAC 1240.

The digital logic portions of any of the Methods may be conveniently placed into one or more custom integrated circuits to provide for a low component count, lower power consumption, and enhanced performance.

Figure 13:
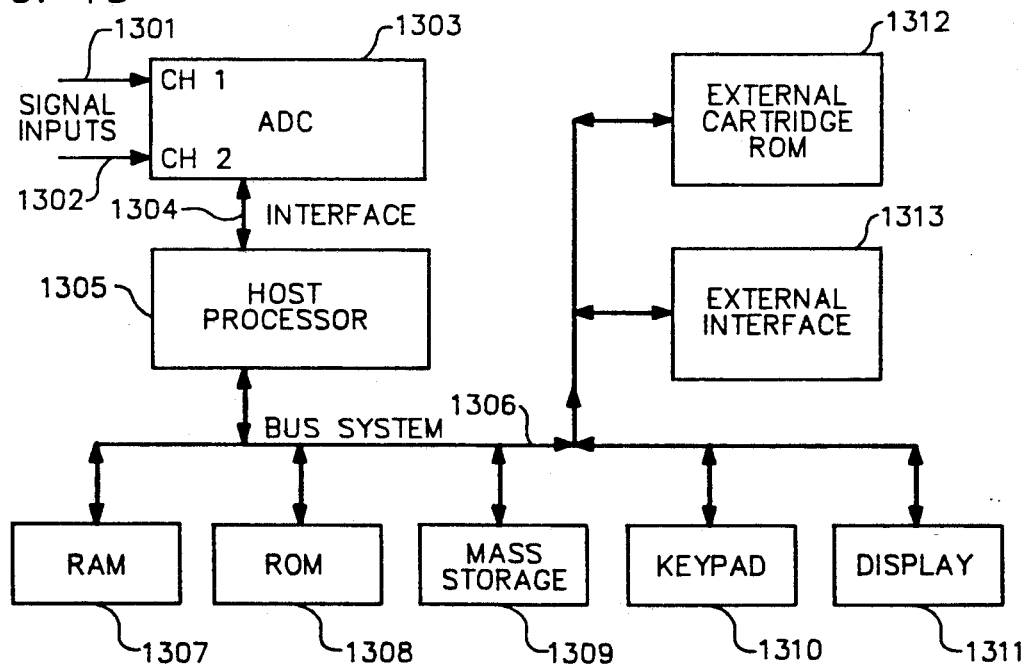
FIG. 13 shows the block diagram of an entire oscilloscope in combination with a VSAC employing one of the above mentioned Methods, and with a host computer, display, keypad, external interface, additional memory, etc.

The host processor or computer 1305 shown in FIG. 13 in the setting of an oscilloscope, may be engineered with any suitable microprocessor or other computing element together with a program memory 1308, data memory ROM 1307, keypad or other user interface 1310, and display 1311. Other elements shown are more or less optional, such as a mass storage device 1307 like a magnetic or optical disk, an external interface 1313 for external control and data transfers, and an external cartridge ROM for optional programs to expand or alter the device's capabilities. The software employed in conjunction with Host 1305 must be engineered to properly operate the invention contained in ADC block 1303 in its various Modes, provide proper timebase parameters and signal related parameters such as gain and offset settings, and receive from the ADC data for display and/or further processing, storage, or transmission. While two signal inputs 1301 and 1302 are shown, the actual number may vary according to specific design requirements.

Figure 4:
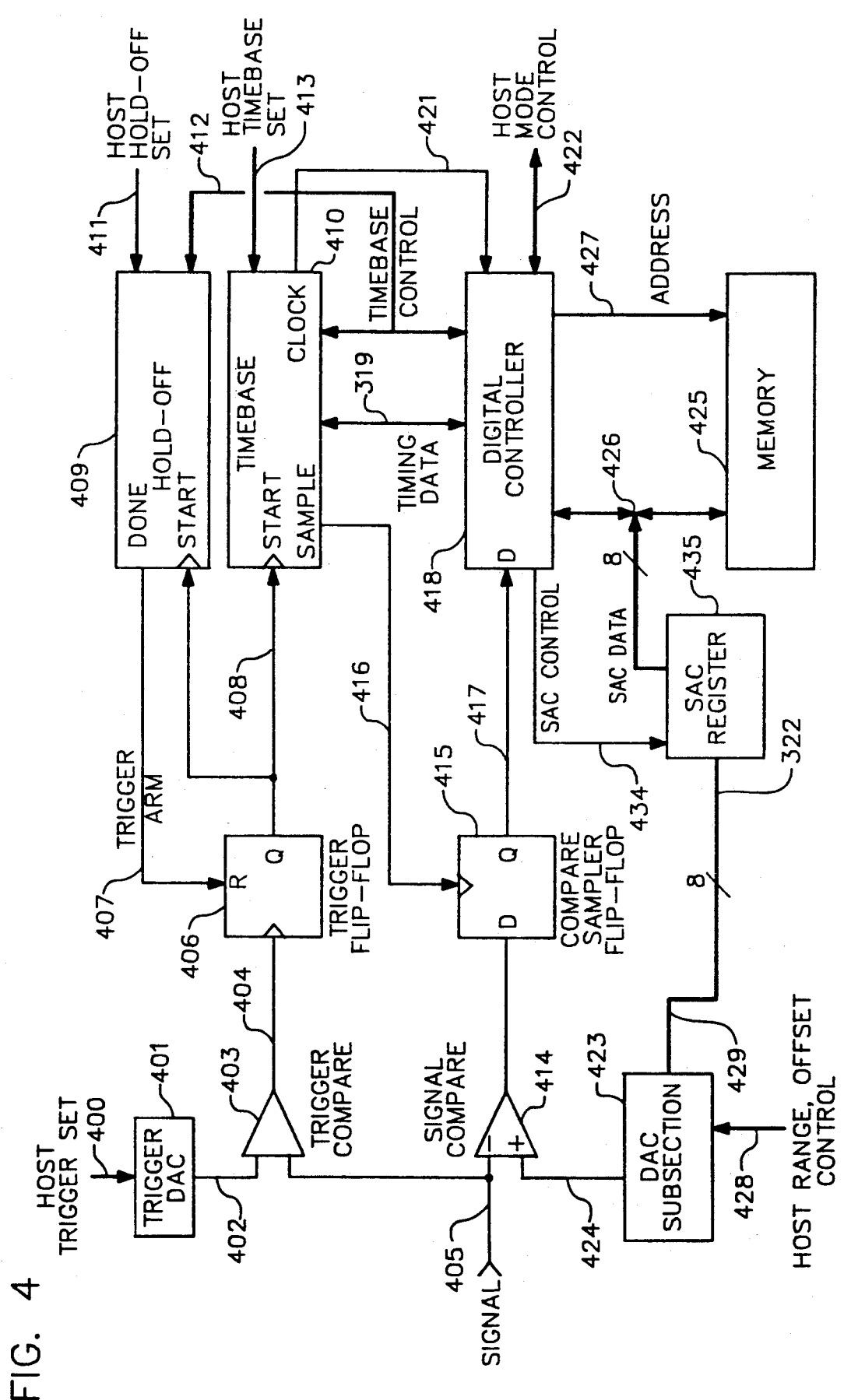
FIG. 4 shows a general block diagram of an embodiment employing VSAC Method 3, wherein a SAC register is used to control a relatively narrow dynamic range DAC, and wherein the output of the DAC is further controlled as to its range and offset to provide a variable range and offset conversion process.

It can be appreciated by those familiar with the art of oscilloscope design that the block diagrams of FIGS. 1, 3, and 4, as well as the detailed diagrams of FIGS. 5, 10 and 12 encompass simplified versions of actual oscilloscope designs. For example, the trigger circuits of these figures do not reveal various trigger filter or trigger polarity circuits. They also do not reveal input signal buffering as might be required for use with high impedance probes, or the use of delay lines to provide for sampling points on or before the trigger point. Also not described are methods for achieving various other timebase modes, for example trigger-after-delay, pretrigger, and 'roll' mode operation. These circuit additions and operating modes are well understood by practitioners in the art, and are not covered here for reasons for explanatory simplification rather than an inability to provide these features.

Control software running on Host 1305 may, for example, analyze the input signal, determine its center amplitude value, and continually compute corrections to the offset parameter (in Method 1, the "seed" value). In this manner, a form of artificial AC signal coupling may be obtained all the while preserving signal information contained in the DC offset, which may be displayed as a number on a screen. In fact the use of the determination of signal center to adjust vertical centering on a display is superior to the area centering method achieved with a DC blocking capacitor, because changes in input waveform duty cycle and shape cannot affect its acquisition offset. Such "pseudo-AC" coupling can be performed over the full input range of the comparator. The use of pseudo-AC coupling has another important implication for trigger threshold setting: as the DC component is always known to the software even if in pseudo-AC mode, an algorithm can be devised which can constantly adjust the trigger threshold to the center of the input waveform even if the input waveform's DC component shifts. Thus, a DC blocking capacitor need not be used in the trigger comparator circuit for AC-coupled triggering, and trigger stability need not depend on the shape and duty cycle of an input signal.

As another example, host software can continually compute new gain factors and send them to the invention in order to continually optimize the acquired signal resolution. This is a form of automatic gain control ("AGC"); in the invention, especially the Method 3 version, the AGC action may be made very smooth and without interruption, detents, or the introduction of glitches into the acquisition process over the entire input signal range. The software can also determine the fundamental frequency component of the acquired signal, and change timebase settings as required to maintain a relatively constant number of waveform cycles on the display or in the memory. And, as timebase delay is also another settable parameter, a mode can be demonstrated which upon command "zooms" into the waveform at a selected point in time and amplitude, centering both the timebase and vertical offset about the point while increasing the timebase setting and effective vertical gain to "blow up" or magnify a section of the waveform along both the X and Y display axis simultaneously.

In frequency analysis systems such as those employing fast-fourier ("FFT") or chirp-z ("CZT") transforms, the resolution to which a signal has been acquired is a major determining factor of the dynamic range of the transform result. While signal averaging can be performed to increase dynamic range, it is generally preferablt to use raw data of as high a resolution as possible for reasons of acquisition speed and jitter-induced temporal smearing. As previously mentioned, the Methods are all fully capable of acquiring to a variable conversion resolution when properly modified. These Methods can be driven by software that changes the value resolution on demand from the user.

In another application, the variable conversion value resolution feature of the modified Methods is used to alternately select waveform acquisition or logic level acquisition modes. When performing waveform acquisition, the conversion process makes use of the number of conversion values desired; when performing logic level acquisition, single level conversion can be performed. As single level acquisition requires far less time to convert each data point than does normal waveform acquisition (one sample clock only versus many sample clocks), logic level acquisition can be made to operate in real time (Mode 1) at far faster rates than normal waveform acquisition. In one practical application, a two channel oscilloscope, one channel could be set for logic level acquisition, while the other channel monitors analog signals. While any of the modified Methods can perform the logic level acquisition function, acquisition memory utilization can be improved by adding a shift register to load numerous comparator output results into a single memory location. A second comparator can also be added to provide fast logic threshold boundary determinations at each sample point. These concepts may be extended to numerous channels if desired.

A time domain reflectometer (TDR) may be fashioned by employing the VSAC technique, provided that the timebase and controlling state machine are suitably altered to accommodate this mode. TDR's are used especially with wire and fiber optic cables to determine various characteristics along their length, and similar techniques are used for radar, ultrasound, sonar, optical radar, network analysis, and many other similar stimulus-response instruments ("SRI"). These systems may be either single-ended (as in most wire-TDR's) or double-ended (as in most network analyzers); in a double-ended system the reponse signal is not connected to the same signal terminal as the transmitted stimulus, but rather arrives from a separate transducer or other connection. As considerable literature exists in these areas, the principles of TDR's and other SRI's will not be discussed except in relation to the operation of the invention.

Figure 14:
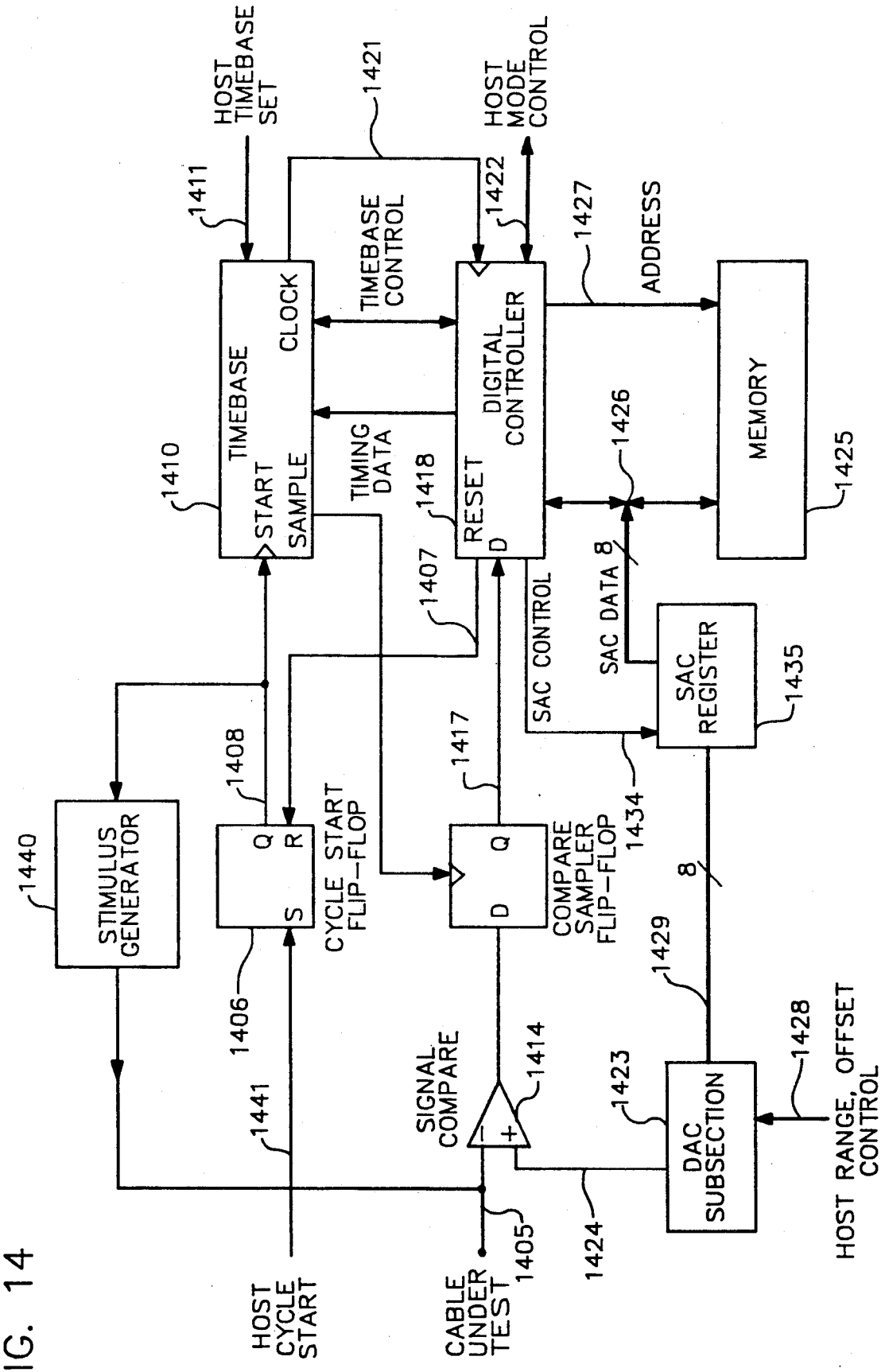
FIG. 14 shows a general block diagram of a stimulus responsive system, such as a time domain reflectometer or network analyzer, incorporating the VSAC circuitry and methods of the invention.

FIG. 14 shows a block diagram of a Method 3 version of the invention as may be applied to most any type of TDR or SRI. Methods 1 and 2 can be similarly modified for this application. Stimulus generator 1440 may be a laser pulser, electrical pulse or step generator, ultrasonic transducer driver, etc. Stimulus generator 1440 is shown driving the same line 1405 that is connected to the input comparator 1414; in many cases these two lines are held separte from each other, for example for two-port measurements as in network analyzers. The line 1441 permits the Hst to initiate each acquisition cycle by setting flip-flop 1406 which in turn starts timebase 1410 running. In some cases it will prove more convenient to employ an oscillator or periodic pulse generator to drive line 1441. The response signal on line 1405 carries the reflections or transformations of the stimulus which usually decays in strength over time. The remainder of FIG. 14 operates the same as was described in conjunction with FIG. 4.

Figure 15:
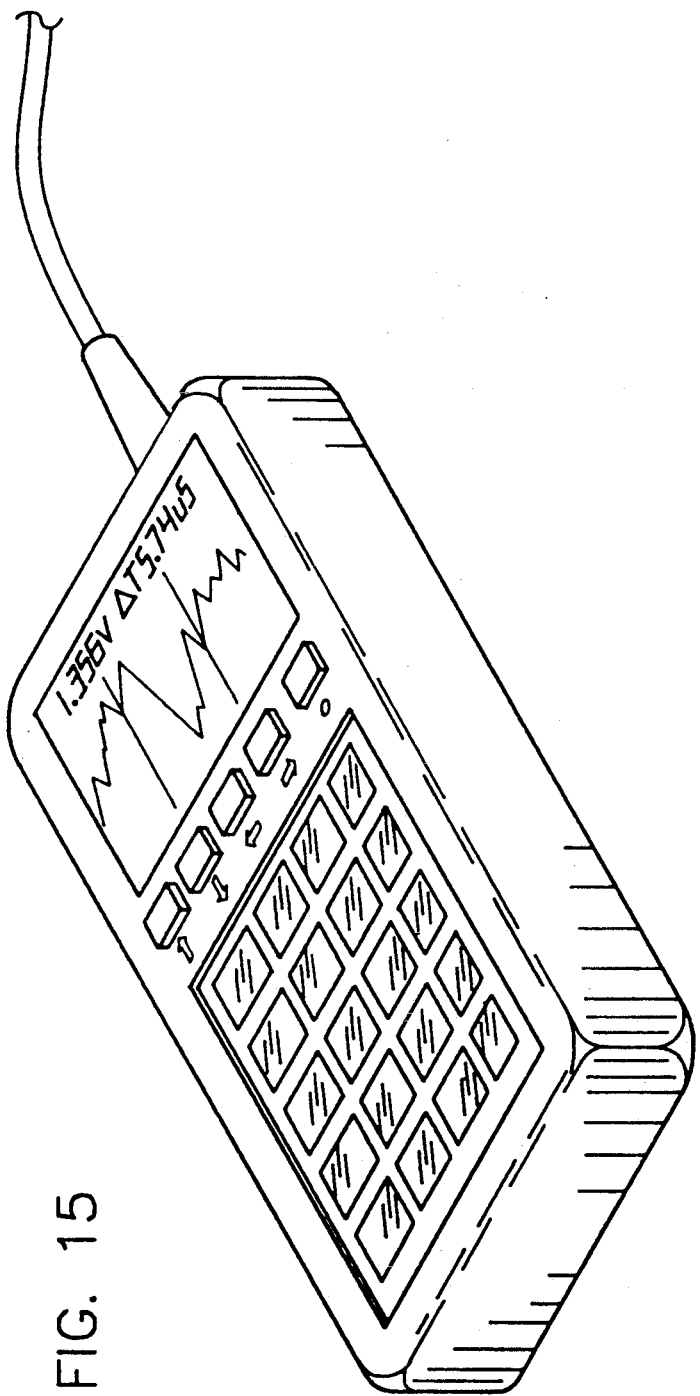
FIG. 15 diagrams a handheld oscilloscope employing one or more of the Methods and embodiments, possessing extremely wide bandwidth, attenuatorless and amplifierless inputs, battery operation, a liquid crystal display, and low cost.

FIG. 15 shows one example of a physical embodiment of the disclosed techniques, a hand-held oscilloscope, a block diagram for which is in FIG. 13. This device can be designed for a 1 Ghz bandwidth, an LCD display, and battery powered operation. Such an instrument incorporating the techniques can have a manufacturing cost of only a few hundred dollars, and compete with much larger instruments costing many thousands of dollars. It can be appreciated also that there are numerous derivatives of oscilloscope technology that may employ the techniques, such as data loggers, continuous embedded-system ADC's as might be found in industrial monitoring and control environments, etc.

As the invention incorporates a number of interrelate techniques employed for the conversion of analog signals to digital form, many of which are novel in their own right, it can be readily seen by those familiar with the art that these techniques can be used independently and adapted to other conversion schemes. For example, the principle of employing a fractional number of the total required sample clocks per waveform repetition as described in Mode 2 in order to increase effective sampling efficiency could be used with a more conventional ADC; it is even possible to combine a flash converter together with the VSAC conversion mechanism of Mode 4 to provide both enhanced lower frequency real time acquisition speed together with full high frequency conversions. A single state machine, timebase, and memory device can be used to control both the flash converter as well as the VSAC converter, depending on the effective acquisition sampling rate selected. A modified version of Mode 3 operation may also be extended to the use of a flash converter, in order to increase sampling efficiency with the use of clock interleaving. In this modified Mode, sample clocks are generated in a fashion similar to that shown for FIG. 8, except that only one waveform repetition for each subset of data points is required. Such variations and permutations employing one or more parts of the invention should be considered within its scope and spirit.

It should also be noted that the Methods and Modes of operation may be employed in isolation without the use of a special purpose DSP or other dedicated controller, if high acquisition speeds are not necessary. For example, the host computer could take over many of the functions of the dedicated controller, such as the computation of timebase delay-t and/or space-t values, and control of the conversion DAC levels. The cost for the hradware required for such simplified systems will be reduced in trade for an increase in complexity of the required host software. Even the digital timebase section may be largely eliminated if only narow temporal windows of sampling are required, sufficiently small to be contained within the range of the fine delay function. Such hardware-reduced systems will find economic advantage for semiconductor device testing, or other applications where the signals being measured are or may easily be made repetitive, and where the signals portions being measured are of a short duration and the total time required for full waveform acquisition is not overly critical. It is even possible to employ a single chip microcomputer to largely replace both the digital portions of the ADC circuits, especially the state machine or other controller, memory, memory address control circuits, ALU, control flow counters etc., as well as the host computer.

Figure 16:
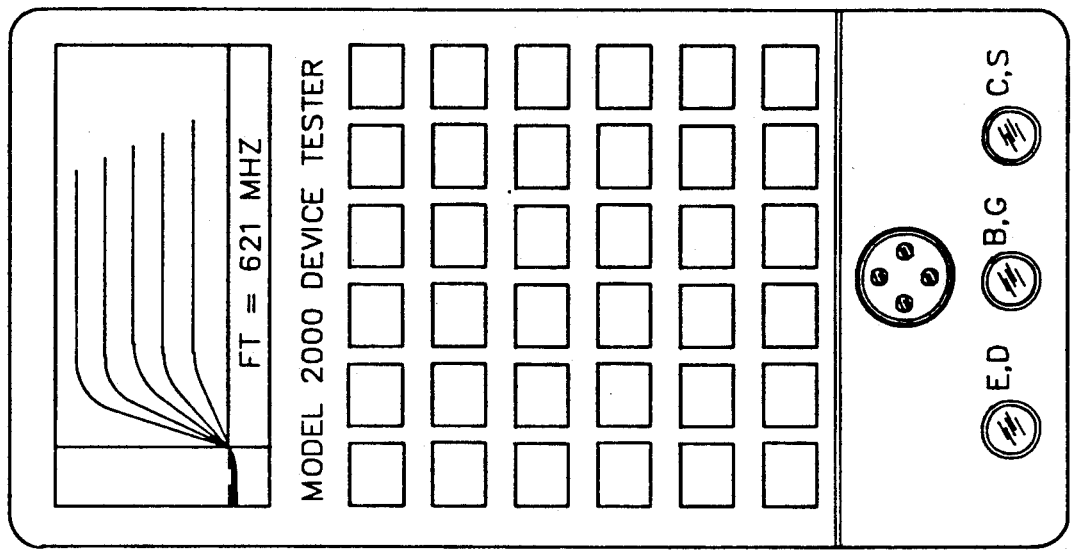
FIG. 16 shows a handheld curve plotter using one or more of the Methods and embodiments of the present invention.

FIG. 16 shows one such application, a handheld semiconductor curve tracer capable of measuring bandwidth parameteres. Virtually all elements of this device except the conversion DAC subsystem, input comparator, fine delay circuit, and sample flip-flop can be incorporated into software within a relatively slow single-chip microcomputer. The gain-bandwidth produce may be determined through a FFT algorithm operating on data input from the device in response to a fast step or pulse. Only Mode 4 of one of the Methods need be employed for this product.

There exists a wide variety of such dedicated ADC applications; as described in conjunction with FIG. 15, some may require only one or more techniques of the invention. For example, a process control system requiring relatively low conversion rates may require just Mode 1 operation of one of the Methods, making use of the wide dynamic range capabilities of the conversion process. Likewise, a TDR or SRI may require only Mode 4 operation if the signal being acquired is so transient in nature that multiple sample clocks per repetition are not feasible. Such subsets of operation of the invention are all to be considered within its scope and spirit. In general, any application where ADC's are now employed or where are reasonably possible can benefit from the invention, even if only by the application of one or more subsets of the methods described.

A further application of the invention would be in the design of automatic test equipment (ATE), where high speed signal acquisition is of great importance, and where the large number of test points indicates the need for numerous expensive signal acquisition circuits. The inherent low cost of the invention in any of its implementations would tend to reduce the cost of such systems while imparting improved performance in many cases.

Numerous other modes of operation and applications not described here are contemplated using one or more aspects of the inventions, in many cases with relatively minor modifications to the foregoing detailed embodiments. Thus it will be understood that numerous changes and modifications can be made to the disclosed embodiments without departing from the spirit of the invention.

I claim:

1. A method of cenverting an analog input signal to digital form, comprising the steps of:
   a first step of comparing the analog input signal with a first analog compare level to generate a digital signal indicative of the comparison result;
   at least one succeeding step of comparing the input signal again with a subsequent analog compare level, wherein the subsequent analog compare level is changed to either higher or lower in amplitude than the proceding analog compare level in the prior step depending on the digital signal of the prior comparison result, and wherein the change in the analog compare level is effected so as to converge on the input signal level, and the defference between successive analog compare levels is of a known magnitude;
   said analog compare levels having variable range for accommodating different analog input signals; and
   storing either the digital results of the comparison between the analog inout signal and each of the analog compare signals, or storing a final digital representation of the analog input signal determined from the succession of comparisons and changes of the analog compare valve.

2. The method of claim 1, wherein the analog input signal or portions thereof has a DC offset, and further comprising the step of:
   variably altering said analog compare levels to effect conversion of the analog input signal with said DC offset or portions with such DC offsets.

3. The method of claim 2, wherein said offset is effected by adding to the analog compare levels a second analog signal which remains substantially constant during the conversion process and is varied between conversions in order to compensate for offsets in the analog input signal.

4. The method of claim 2, wherein the analog compare level is set by a DAC having a dynamic range greater than nominally required by the conversion of the input analog signal, and wherein the offset is variably altered by using a programmable digital lookup table to add or subtract an amount from the compare level signal.

5. The method of claim 4, wherein the contents of the lookup table are selected to provide an intentionally nonlinear transformation of the input signal to digital form.

6. The method of claim 1, wherein the analog inout signal has a range of different amplitudes and further comprising the step of:
   variably altering the difference in magnitude between the analog compare levels of successive steps to effect conversion of the analog input signal having said range of different amplitudes.

7. The method of claim 6, where the analog compare level is set by a DAC process of conversion from digital to analog form, said DAC process having a dynamic range selected to be greater than nominally required by the process of converting the analog input signal, and wherein the offset is altered by using a variably adjustable initial digital seed valve for the compare level of the first step, to which in said successive steps successively smaller differentials of magnitude are added or substracted.

8. The method of claim 6 wherein the analog compare level is set by a DAC process conversion from digital to analog form, said DAC process having a dynamic range large enough to permit use of a range of subsets of said dynamic range in the process of converting the analog input signal, and where the set of differences in magnitudes between the compare level of any of said steps and the prior step is variable by altering a digital delta value that is divided or reduced in a consistent manner from one step to another.

9. The method of claim 6, wherein the range of different amplitudes between the analog compare level of said successive steps is made varied by an analog multiplier or divider that provides a multiplication of division ratio, such that the multiplication or division ratio is varied according to the conversion gain.

10. The method of claim 6, wherein the analog compare level is set by a DAC having a dynamic range greater than nominally required by the conversion of the input analog signal, and wherein the differences in magnitudes between the compare level of any of said successive steps are varied by a programmable digital lookup table.

11. The method of claim 10, wherein the contents of the lookup table are selected to provide an intentionally nonlinear transformation of the input signal to digital form.

12. The method of claim 1, wherein the total number of successive comparison steps is a controllable variable, according to predetermined resolution of the conversion process from analog to digital.

13. The method of claim 1, wherein the successive steps occur during multiple repetitions of the analog input signal, and wherein the conversion of a single data point of the repeating input signal is made by making use during each of the above steps of the digital signal result of the comparison between the input signal and the compare level at a substantially corresponding temporal point along the repeating input signal.

14. The method of claim 13, wherein successive ones of said steps occur during a single repetition of the analog input signal.

15. The method of claim 1, comprising the converting of the analog input signal to digital form at multiple different temporal points along a waveform of the input analog signal, in order to provide a digital conversion of a plurality of points along the length of said waveform.

16. The method of claim 15, wherein the multiple different temporal points are temporally spaced apart along a time base of the input signal by means of a variable delay from an anitial starting time.

17. The method of claim 1, wherein the process of conversion from analog to digital form is made synchronous to an otherwise asynchronous input signal by a triggering means that causes the conversion process to occur in concert with the analog input signal.

18. The method of claim 1, wherein the analog input signal occurs as a response to a stimulus signal made substantially synchronous to the process of conversion from analog to digital form.

19. A system for converting an analog input signal to digital form by variable successive sampling, comprising:
   compare means for successively comparing an amplitude of the analog input signal with a variable compare signal and having a digital output;
   comapre signal producing means for producing said variable compare signal, said compare signal producing means changing said variable compare signal on successive operations of said comparator means to a relatively higher or lower value depending on the digital output of said comparator means and with successively decreasing magnitudes of change so as to converge on the analog input signal, and said compare signal producing means having a controllable range for accommodating different input signals; and storing means for storing digital data representing said digital output of said comparator means.

20. The system of claim 19, wherein said compare signal producing means comprises means for producing said variable compare signal with said controllable range so as to inteoduce either or both a variable DC offset and a variable gain for the converted digital form of the analog input signal.

* * * * *